(12) United States Patent
Zhang et al.

(10) Patent No.: US 11,456,279 B2
(45) Date of Patent: Sep. 27, 2022

(54) INTEGRATED ELECTRONIC ELEMENT MODULE, SEMICONDUCTOR PACKAGE, AND METHOD FOR FABRICATING THE SAME

(71) Applicant: Western Digital Technologies, Inc., San Jose, CA (US)

(72) Inventors: Cong Zhang, Shanghai (CN); Chin-Tien Chiu, Taichung (TW); Xuyi Yang, Shanghai (CN); Qi Deng, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 11 days.

(21) Appl. No.: 16/887,107

(22) Filed: May 29, 2020

(65) Prior Publication Data

US 2021/0043602 A1 Feb. 11, 2021

(30) Foreign Application Priority Data

Aug. 8, 2019 (CN) .......................... 201910728015.2

(51) Int. Cl.
*H01L 21/78* (2006.01)
*H01L 23/00* (2006.01)
*H01L 21/48* (2006.01)
*H01L 21/56* (2006.01)
(Continued)

(52) U.S. Cl.
CPC .......... *H01L 24/96* (2013.01); *H01L 21/4853* (2013.01); *H01L 21/4857* (2013.01); *H01L 21/561* (2013.01); *H01L 21/565* (2013.01); *H01L 21/568* (2013.01); *H01L 21/78* (2013.01); *H01L 23/5383* (2013.01); *H01L 23/5386* (2013.01); *H01L 24/16* (2013.01); *H01L 25/0657* (2013.01); *H01L 2224/16227* (2013.01); *H01L 2224/95001* (2013.01);
(Continued)

(58) Field of Classification Search
CPC ..... H01L 24/96; H01L 24/16; H01L 21/4853; H01L 21/4857; H01L 21/561; H01L 21/265; H01L 21/568; H01L 21/78; H01L 23/5383; H01L 23/5386; H01L 25/0657; H01L 2224/16227; H01L 2224/95001; H01L 2224/06506; H01L 2224/06562; H01L 2224/06582
See application file for complete search history.

(56) References Cited

U.S. PATENT DOCUMENTS

| | | | |
|---|---|---|---|
| 9,825,007 B1 * | 11/2017 | Chen | H01L 21/486 |
| 9,832,883 B2 * | 11/2017 | Zhang | H05K 3/282 |
| 2017/0148744 A1 * | 5/2017 | Carson | H01L 21/561 |

* cited by examiner

*Primary Examiner* — Timor Karimy
(74) *Attorney, Agent, or Firm* — Vierra Magen Marcus LLP

(57) ABSTRACT

A substrate-less integrated electronic element module for a semiconductor package, comprising: at least two electronic elements, each of the at least two electronic elements having first electrical connectors; and a first molding compound encapsulating the at least two electronic elements, the first molding compound comprising a first planar surface and an opposing second planar surface of the integrated electronic element module, wherein each of the first electrical connectors is directly exposed on the first planar surface of the integrated electronic element module. Further, a semiconductor package including the integrated electronic element module and the method of fabricating the same is provided.

18 Claims, 21 Drawing Sheets

(51) Int. Cl.
*H01L 23/538* (2006.01)
*H01L 25/065* (2006.01)
(52) U.S. Cl.
CPC ............... *H01L 2225/06506* (2013.01); *H01L 2225/06562* (2013.01); *H01L 2225/06582* (2013.01)

INTEGRATED ELECTRONIC ELEMENT MODULE, SEMICONDUCTOR PACKAGE, AND METHOD FOR FABRICATING THE SAME

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives.

Non-volatile semiconductor storage devices are generally in the form of semiconductor package. In a semiconductor package, semiconductor devices (such as, die stacks, chips) and electronic elements (such as application specific integrated circuits (ASICs), passive devices, for example, capacitors) with electrical connections of different sizes, different types need to be provided. In an application for memory package, arrangement density of semiconductor devices and electronic elements in the package is becoming higher as the memory package evolves toward high capacity, minimized, and compact design. Thus, capacitors in memory packages need to provide larger capacitance to better serve the functions of denoising, suppressing surge voltage, filtering and so on. In some application, the capacitance is typically up to 25 µF. An example of the capacitor includes, but is not limited to, Silicon-based (Si-based) capacitors, multi-layered ceramic capacitors (MLCCs), etc. Typically, Si-based capacitors provides a very small capacitance per unit area, and thus an undesirably large footprint is needed for satisfying a typical capacitance requirement. MLCCs have various different shapes and sizes, and are generally mounted on a substrate using surface mounting technology (SMT) process, and thus having different footprint requirements on the substrate.

It can be seen that there is a need for an improved solution for providing electronic elements with different sizes and different type in a semiconductor package, in particular for an improved solution for fabricating such semiconductor package with high density of elements.

DESCRIPTION OF THE DRAWINGS

The accompanying drawings illustrate some embodiments, which are not drawn to scale, and do not limit the meaning and the scope in any way. Rather, the figures are only for the purpose of illustration, and should not be construed as that all features presented in the figures are necessary or preferable features of the technical solution. For the sake of simplicity and clarity, if a certain feature has been labelled in a former figure, reference numeral for said feature may be omitted in subsequent figures. In flow charts, the order for steps of a method should not be construed to be limited by the depicted order. Like reference numerals denote like features throughout the figures, in which.

DETAILED DESCRIPTION

Figure 1A:
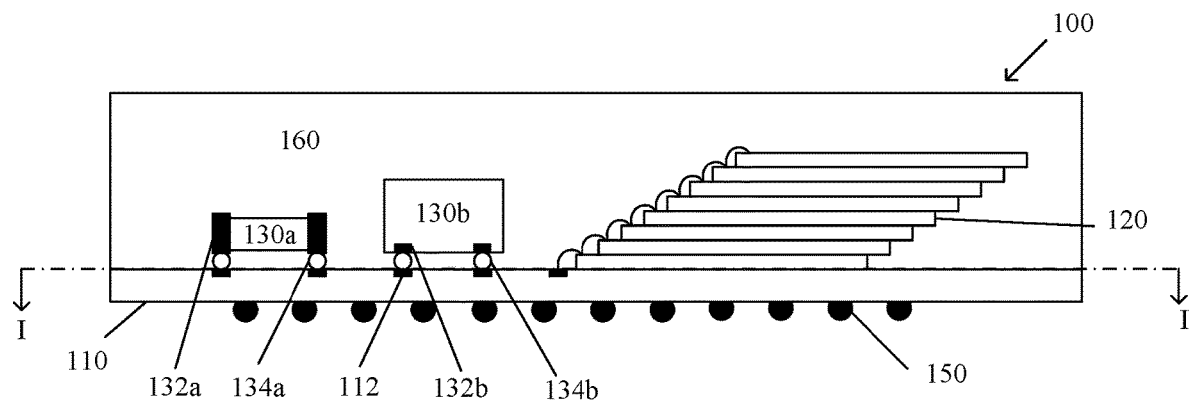
FIG. 1A illustrates a cross-section side view of a semiconductor package.

Unless otherwise defined, technical or scientific terms used herein shall be taken in the ordinary meaning as understood by one of ordinary skill in the art. The words "first", "second" and similar terms used in the specification and claims of the invention may be used to describe various elements, components, regions, layers, steps and/or sections, but does not define any order, quantity, or importance. These words are only used to distinguish between one or more of elements, components, regions, layers, steps, and/or segments. Similarly, the words "a" or "an" and the like are not intended to define a quantity limitation, but intended to define the existence of at least one.

Spatially related terms such as "on", "under", "upper", "lower", "above", "below", etc., may be used herein to describe the relationship between one element or feature and another one or more elements or features as illustrated in the FIG.s, for ease of description. These spatially related terms are intended to encompass different orientations of the device in use or operation, in addition to the orientation depicted in the figures. For example, if the device is turned over, a certain element or feature described as "under", "below" or "beneath" another element or feature would orient above another element. In addition, it will be interpreted that when an element or feature is described as "between" two elements and features, the element and feature can be understood as the only one element or feature between the two elements and features, or there are also one or more intervening elements or features. It will also be interpreted that when an element or feature is described as "on", "connected to", "coupled to", "attached to" another element or feature, it can be directly "on", "connected to", "coupled to", "attached to" another element or feature, or one or more intervening element or feature can also be present. In contrast, when an element or feature is described as "directly on", "directly connected to", "directly coupled to", "directly attached to" another element or feature, there is no intervening element or feature.

As will be appreciated by those skilled in the art, these components, devices, apparatus, systems can be connected, arranged, and configured in any manner. Words such as "including", "comprising", "having", and the like, should be interpreted as "including but not limited to" and may be used interchangeably. The terms "or" and "and" are used herein to mean the term "and/or" and are used interchangeably unless the context clearly indicates otherwise. As used herein, "such as" refers to the phrase "such as but not limited to" and is used interchangeably.

In addition, the use of "or" in the listing of the items beginning with "at least one" indicates an enumerated list, such that an enumeration such as "at least one of A, B or C" means A or B or C, or AB or AC or BC, or ABC (i.e., A and B and C). Furthermore, the word "exemplary" is used to indicate a schematic description and does not mean that the described examples are preferred or better than the other examples. To the extent possible, features in different embodiments may be combined with one another while still achieving the desired effects. The features, effects, and advantages described with respect to an embodiment may also be applicable to other embodiments, unless the context explicitly states otherwise.

As used herein, a term "thickness" refers to a distance between an upper surface and a lower surface of a feature or structure in a vertical direction in various cross-section views (such as, FIG. 1A, FIG. 2, FIG. 3A, FIG. 4A, FIG. 5A, FIGS. 6-10, FIGS. 13A-13G, and FIGS. 15A-15K). By way of example, a thickness of a first molding compound 340 is a distance between a first planar surface 342 and a second planar surface 344 of the first molding compound 340 in a vertical direction, as shown in FIG. 3A.

FIG. 1A is a cross-section side view illustrating a semiconductor package 100. The semiconductor package 100 includes a substrate 110, a semiconductor device 120 and individual electronic elements 130a and 130b mounted over the substrate 110, and a molding compound 160, the molding compound 160 encapsulating the semiconductor device 120 and the individual electronic elements 130a and 130b over an upper surface of the substrate 110. As shown in FIG. 1A, the semiconductor device 120 can be a stack of memory dies, and the electronic element 130a and 130b can be individual passive devices, such as capacitors in the form of MLCC.

The substrate 110 includes soldering pads 112 formed over the upper surface of the substrate 110, the electronic elements 130a and 130b including electrical connectors 132a and 132b, such as bonding pads, formed over surfaces of the electronic elements 130a and 130b, respectively. The soldering pads 112 are electrically connected with the electrical connectors 132a and 132b of the individual electronic elements 130a and 130b, respectively. By way of example, the soldering pads 112 are electrically connected with the electronic element 132a and 132b via conductive bumps 134a and 134b, respectively, and dies in the die stack serving as the semiconductor device 120 are electrically interconnected with each other and electrically connected to the soldering pads 112 via wire bonds (not labelled in FIG. 1A). A lower surface of the substrate 110 can also be formed with conductive structures thereon for electrical connection with external structures, such as a ball grid array (BGA) 150.

Figure 1B:
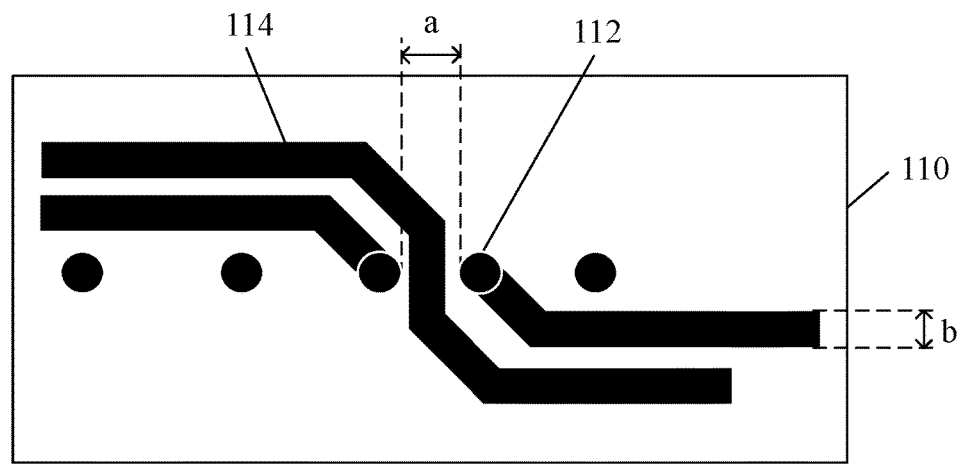
FIG. 1B is a cross-section view of the semiconductor package in FIG. 1A taken along line I-I.

FIG. 1B is a cross-section view of the semiconductor package in FIG. 1A taken along line I-I, showing a portion of the upper surface of the substrate 110 of the semiconductor package 100. The substrate 110 includes soldering pads 112 and conductive patterns 114 located over the upper surface thereof. Conductive patterns 114 can also be formed in intermediate layer(s) and a lower surface of the substrate 110, and connect various devices in the semiconductor package. As shown in FIG. 1B, at least one conductive pattern 114 can pass between at least a pair of adjacent soldering pads 112. The pair of adjacent soldering pads 112 has a gap a between the closest soldering pads, and the conductive patterns 114 has a width b. Typically, the width b of the conductive patterns 114 is larger than 20 μm. The gap a between the closest soldering pads 112 is larger than the width b by at least two times of a safety clearance, and thus is typically larger than 30 μm, or larger than 50 μm in some cases.

Figure 2:
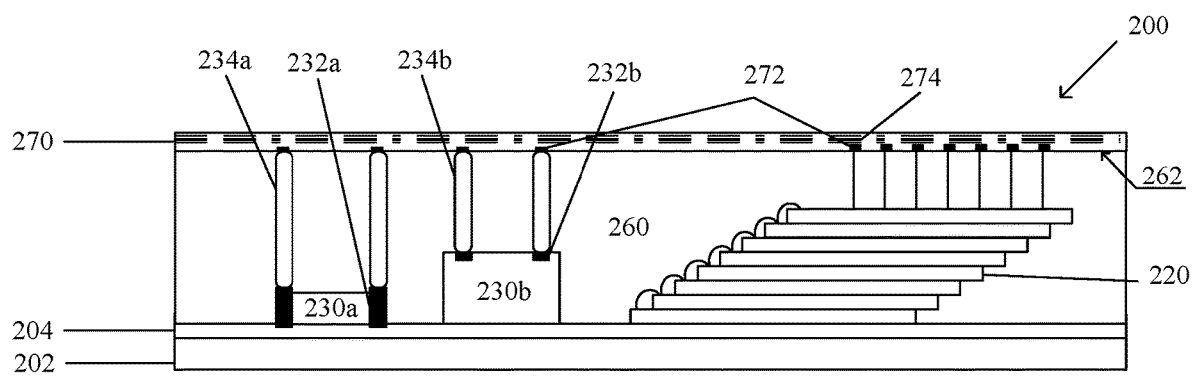
FIG. 2 illustrates a cross-section side view of a semiconductor package during fabrication process.
Figure 3A:
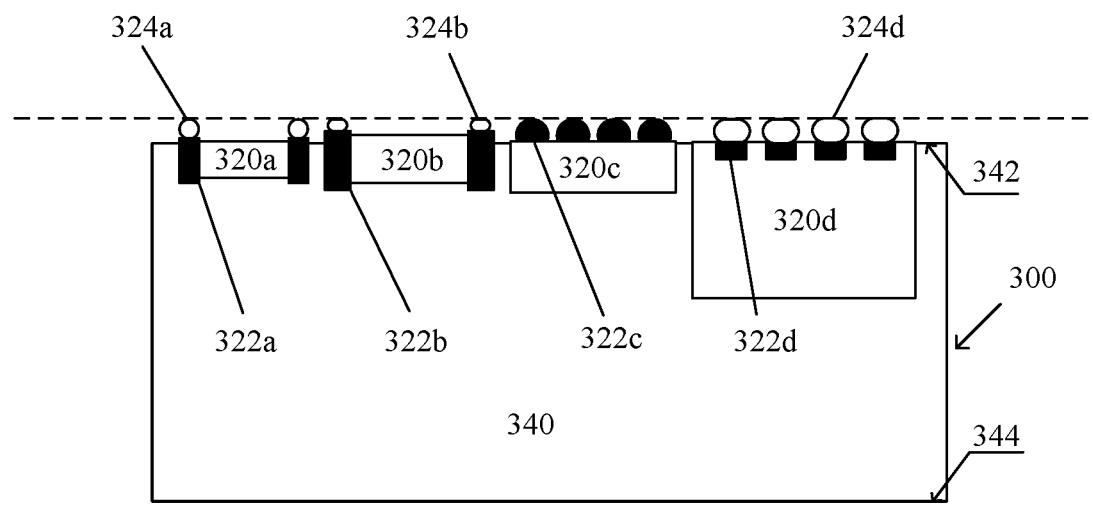
FIG. 3A is a cross-section side view illustrating an integrated electronic element module according to one embodiment.

FIG. 2 is a cross-section side view of a semiconductor package 200. Similar to the semiconductor package 100, the semiconductor package 200 includes a semiconductor device 220, individual electronic elements 230a and 230b, and a molding compound 260 encapsulating the semiconductor device 220 and the individual electronic elements 230a and 230b. The semiconductor package 200 also includes a redistribution layer (RDL) 270 formed over an upper surface of the molding compound 260. The RDL 270 includes a plurality of electrically connecting structures 272 located on a lower surface of the RDL 270. The semiconductor device 220 are electrically connected to electrically connecting structures 272 on the lower surface of the RDL 270 via electrical connectors, such as vertical wire bonds. The electrical connectors 232a and 232b of the electronic elements 230a and 230b are electrically connected to the electrically connecting structures 272 on the lower surface of the RDL 270 via elongated conductive structures 234a and 234b, respectively. In the semiconductor package 200 shown in FIG. 2, as the thicknesses of the electronic elements 230a and 230b are generally much smaller than that of the semiconductor device 220, height-width ratios of the elongated conductive structures 234a and 234b are very high, leading to high cost and low efficiency in the fabrication process.

FIG. 3A is a cross-section side view illustrating an integrated electronic element module 300 according to one embodiment. The integrated electronic element module 300 includes a plurality of electronic elements 320a, 320b, 320c and 320d, and a first molding compound 340 encapsulating a plurality of electronic elements 320a, 320b, 320c and 320d. The electronic elements 320a, 320b, 320c and 320d may include, but are not limited to, passive elements, general purpose integrated circuits, application specific integrated circuits (ASICs), wafer-level chip-scale packages (WLCSPs), and quad flat no-lead package low dropouts (QFN/LDOs), etc. The passive elements may include, but are not limited to, capacitors (such as multi-layered ceramic capacitors (MLCCs), Si-based capacitors), resistors, and inductors, etc.

Each of the plurality of the electronic elements 320a, 320b, 320c and 320d has first electrical connectors 322a, 322b, 322c and 322d for external electrical connection with the integrated electronic element module 300, respectively. In one example, the electronic elements 320a and 320b can be SMT elements, such as MLCC. In such case, the first electrical connectors 322a and 322b of the electronic elements 320a and 320b be, for example, at least two connection terminals formed at both ends of upper surfaces of the electronic elements 320a and 320b, respectively. In one example, the electronic element 320c can be an ASIC, a general purpose integrated circuit, a wafer-level chip-scale package, etc. In such case, the first electrical connectors 322c of the electronic element 320c can be conductive balls or conductive bumps. In one example, the electronic element 320d can be a quad flat no-lead package (QFN), a Si-based element, etc. In such case, the first electrical connectors 322d of the electronic element 320d can be bonding pads or a bonding pad array formed on the surface of the electronic element 320d. In an embodiment shown in FIG. 3A, the types, numbers and arrangements of the electronic elements 320a, 320b, 320c and 320d and the first electrical connectors 322a, 322b, 322c and 322d are only by way of example, and different types, numbers and arrangements can be utilized in other embodiments. Particularly, one or more of the electronic elements 320a, 320b, 320c and 320d may also have dummy electrical connectors (not shown), such as, dummy bonding pads, dummy conductive balls, dummy terminals etc., without electrical connection with external structures of the integrated electronic element module 300, which are not first electrical connectors in the context.

In one example, the first molding compound 340 includes a first planar surface 342 and an opposing second planar surface 344. Each of the first electrical connectors 322a, 322b, 322c and 322d of the electronic elements 320a, 320b, 320c and 320d is exposed on the first planar surface 342 to be suitable for electrical connections of a semiconductor package, as described hereafter in more detail. As used herein, the molding compound 340 refers to a material for encapsulating elements and/or devices therein to protect the elements and/or devices from damages due to mechanical impact, moisture, and oxidization and so on. The materials for the molding compound 340 may include, but are not limited to, epoxy resins, phenolic resins and so on. As used herein, terms referring to particular features "exposed" on a particular surface include cases where said features are not covered by the materials forming the surface and are substantially coplanar with the surface, and case where said features protrude from the surface.

In one example, the first electrical connectors 322d of the electronic element 320d are substantially coplanar with the first planar surface 342, while the first electrical connectors 322a, 322b and 322c of the electronic elements 320a, 320b and 320c are protruding from the first planar surface 342, and heights of the first electrical connectors 322c of the electronic element 320c with respect to the first planar surface 342 is greater than a height of any of the first electrical connectors 322a and 322b of the electronic elements 320a and 320b with respect to the first planar surface 342. In such case, a distance from a top surface of the first electrical connectors 322c of the electronic element 320c to the first planar surface 342 is greater than a distance from any of the first electrical connectors 322a, 322b and 322d of the electronic elements 320a, 320b and 320d to the first planar surface 342. A part of the first electrical connectors 322a, 322b, 322c and 322d has conductive bumps formed thereon. In one example, conductive bumps 324a, 324b and 324d are formed over the first electrical connectors 322a, 322b and 322d of the electronic elements 320a, 320b and 320d, while no conductive bumps are formed over the first electrical connectors 322c. Top surfaces of the conductive bumps 324a, 324b and 324d and top surfaces of the first electrical connectors 322c of the electronic element 320c are coplanar with each other, as indicated by a dash line in FIG. 3A. In other words, heights of the conductive bumps 324a, 324b and 324d and heights of the first electrical connectors 322c with respect to the first planar surface 342 are equal. The conductive bumps may include, but are not limited to, copper bumps, copper/gold bumps, solder, conductive material pillars and the combination thereof. In one example, the heights of the first electrical connectors 322c of the electronic element 320c with respect to the first planar surface 342 are greater than the height of any one of the other first electrical connectors 322a, 322b and 322d with respect to the first planar surface 342. Therefore, it is not necessary to form conductive bumps over the first electrical connectors 322c. In such case, top surfaces of the first electrical connectors 322c are coplanar with top surfaces of the conductive bumps 324a, 324b and 324d, so that the first electrical connectors 322c and the conductive bumps 324a, 324b and 324d can be directly connected to electrical connections on a planar surface of a semiconductor package, such as an RDL. It should be understood that the heights of the first electrical connectors 322a, 322b, 322c and 322d of the electronic elements 320a, 320b, 320c and 320d with respect to the first planar surface 342 as shown in FIG. 3A and/or being coplanar with the first planar surface 342, are only for the purpose of illustration. The first electrical connectors 322a, 322b, 322c and 322d can have different height profiles in other embodiments.

Figure 3B:
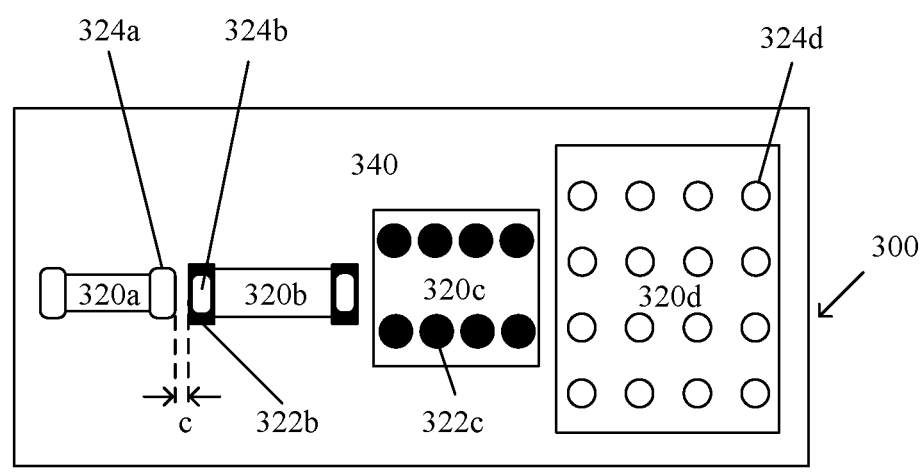
FIG. 3B is a top view of the integrated electronic element module in FIG. 3A.

FIG. 3B is a top view of the integrated electronic element module 300 in FIG. 3A. In one example, the size of the conductive bumps 324a can be substantially the same as the size of the corresponding first electrical connectors 322a, the size of the conductive bumps 324b can be smaller than the size of the corresponding first electrical connectors 322b, or the size of the conductive bumps 324d can also be larger than the size of the corresponding first electrical connectors 322d. In one example, a smallest gap between the first electrical connectors 322a, 322b, 322c and 322d is a gap c between the closest adjacent first electrical connectors 322a and 322b, which can be smaller than 20 µm, preferably smaller than 10 µm. In contrast, when using SMT process for mounting electronic elements in a semiconductor package, larger gaps need to be reserved between terminals (i.e., electrical connectors or conductive bumps thereon for an electronic element), typically on an order of 100-200 µm, in order to prevent short between the terminals due to partial flow of solders during reflow process.

The integrated electronic element module 300 shown in FIG. 3A-FIG. 3B allows various electronic elements with different sizes and different electrical connectors to be arranged in a single component so as to increase an integration density of the electronic elements. When the integrated electronic element module 300 is used in a semiconductor package, the first electrical connectors of the electronic elements can be arranged with a relatively smaller gap c as described above. This helps to increase a density of the elements, and minimize of the size of the package. With this configuration, a substrate may not be used, and an SMT process may not be omitted, thus further reducing the package size and simplifying the process. In some embodiments, an arrangement of the electronic elements in the integrated electronic element module 300 can be adapted based on design specifications of the semiconductor package, in order to further increase the utilization of the available area in the package, as will be described hereafter with reference to FIGS. 11A-11B in more detail. In addition, electrical connectors of various electronic elements are coplanar with each other in the integrated electronic element module 300, thus facilitating the electrical connections on a planar surface of a semiconductor package, such as an RDL, as will be described hereafter in more detail. Preferably, the integrated electronic element module 300 has a shape and thickness adaptable for the design specifications of a semiconductor package, as will be described hereafter with reference to FIG. 5A-FIG. 11B in more detail.

In some embodiments, the electronic elements 320a, 320b, 320c, and 320d in the integrated electronic element module 300 are all passive devices such as capacitors (e.g., MLCC, silicon-based capacitors, etc.), inductors, and resistors. As described above, these passive devices typically have various different sizes, shapes, and means for electrical connection, and thus typically need to be mounted over a substrate of a semiconductor package using, for example, an SMT process, which has low area utilization ratio. By integrating these passive components in the integrated electronic element module 300 in a manner of the embodiments described with reference to FIGS. 3A-3B, these passive components can be compactly arranged in the integrated electronic element module 300 having a relatively regular shape to reduce the footprint on the semiconductor package. In such case, all of the first electrical connections of the passive devices distributed coplanar with each other, thus facilitating subsequent direct connection to electrical connections on a planar surface, such as an RDL, of the semiconductor package without further adjustment of the height of each first electrical connector, as will be described below in more detail.

Figure 4A:
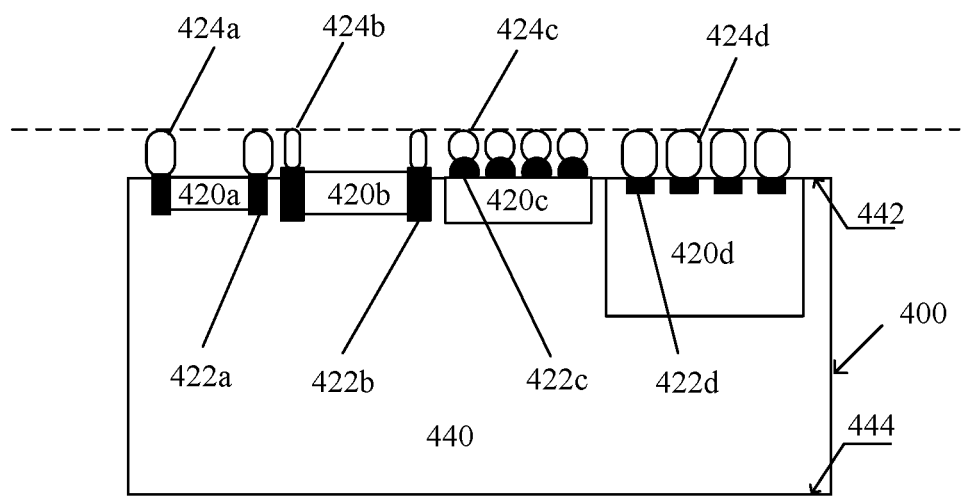
FIG. 4A is a cross-section side view illustrating an integrated electronic element module according to another embodiment.

FIG. 4A is a cross-section side view illustrating an integrated electronic element module 400 according to another embodiment. For the sake of simplicity, the following description of the integrated electronic element module 400 with reference to FIG. 4A has omitted contents similar to those described with reference to the integrated electronic element module 300 in FIG. 3A. The integrated electronic element module 400 includes a plurality of electronic elements 420a, 420b, 420c and 420d, and a first molding compound 440 encapsulating the plurality of electronic elements 420a, 420b, 420c and 420d. The configurations of the electronic elements 420a, 420b, 420c and 420d and the first molding compound 440 of the integrated electronic element module 400 are substantially similar to those of the electronic elements 320a, 320b, 320c and 320d and the first molding compound 340 of the integrated electronic element module 300, and a detailed description thereof is thus omitted.

In one example, each of the first electrical connectors 422a, 422b, 422c and 422d of the electronic elements 420a, 420b, 420c and 420d is formed with conductive bumps 424a, 424b, 424c and 424d thereon. Top surfaces of the conductive bumps 424a, 424b, 424c and 424d are coplanar with each other, as indicated by a dash line in FIG. 4A. Therefore, the conductive bumps 424a, 424b, 424c and 424d can be directly connected to electrical connections on a planar surface of a semiconductor package, such as an RDL.

Figure 4B:
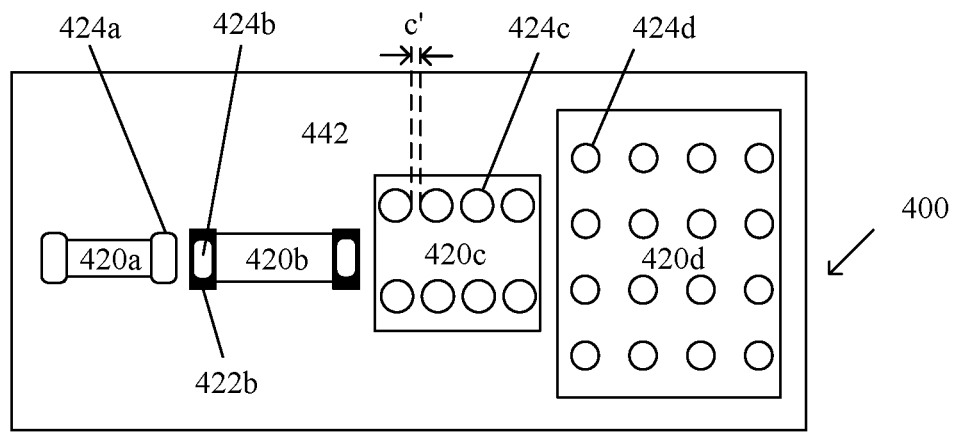
FIG. 4B is a top view of the integrated electronic element module in FIG. 4A.

FIG. 4B is a top view of the integrated electronic element module 400 in FIG. 4A. In one example, in FIG. 4B, the smallest gap between the first electrical connectors 422a, 422b, 422c and 422d is a gap c' between the closest adjacent first electrical connectors 422c, which can be smaller than 20 preferably smaller than 10 μm.

It should be understood that, although FIG. 3A and FIG. 4A show that first electrical connectors of each of the electronic elements have the same height with respect to the first planar surface, first electrical connectors of the electronic elements can have different heights. In such case, conductive bumps can also be formed over all or part of the first electrical connectors in the above described manner, so that the top surfaces of the electrical connectors of the electronic elements can be coplanar with each other. In addition, in other embodiments, all of the first electrical connectors of the electronic elements can also be substantially coplanar with the first planar surface, or all of the electrical connectors can have the same height with respect to the first planar surface. In such case, it is not necessary to form conductive bumps over the first electrical connectors, because all top surfaces of the first electrical connectors are coplanar with respect to each other. Alternatively, in such case, a conductive bump can be formed on each of the first electrical connectors, and top surfaces of the conductive bumps are coplanar with each other.

Figure 5A:
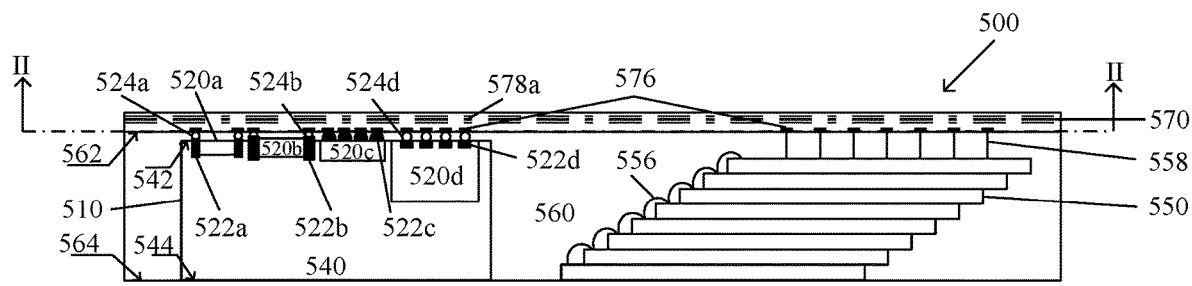
FIG. 5A is a cross-section side view illustrating a semiconductor package according to one embodiment.

FIG. 5A is a cross-section side view illustrating a semiconductor package 500 according to one embodiment. In one example, the semiconductor package 500 includes an integrated electronic element module 510; a semiconductor device 550; a second molding compound 560 encapsulating the integrated electronic element module 510 and the semiconductor device 550, the second molding compound 560 including a third planar surface 562 and an opposing fourth planar surface 564; and an RDL 570 formed over the third planar surface 562, used for electrical connection with the integrated electronic element module 510 and the semiconductor device 550.

In one example, the integrated electronic element module 510 includes electronic elements 520a, 520b, 520c and 520d, and a first molding compound 540 encapsulating electronic elements 520a, 520b, 520c and 520d. The first molding compound 540 includes a first planar surface 542 and an opposing second planar surface 544. Each of the electronic elements 520a, 520b, 520c and 520d has first electrical connectors 522a, 522b, 522c and 522d for electrically connecting with the RDL 570, and each of the first electrical connectors 522a, 522b, 522c and 522d is exposed on the first planar surface 542. In one example, conductive bumps 524a, 524b and 524d are formed over the first electrical connectors 522a, 522b and 522d, while no conductive bumps are formed over the first electrical connectors 522c. In such case, top surfaces of the conductive bumps 524a, 524b and 524d are coplanar with top surfaces of the first electrical connectors 522c, i.e., coplanar at a certain plane, and this plane is substantially coplanar with the third planar surface 562 of the second molding compound 560. Therefore, the conductive bumps 524a, 524b and 524d and the first electrical connectors 522c are suitable for being directly electrically connected with electrical contacts 576 on a planar lower surface of the RDL 570.

In one example, the semiconductor device 550 can be a die stack. The die stack has wire bonds 556 for electrical interconnection between dies, and second electrical connectors 558 extending upwards and exposed on the third planar surface 562 of the second molding compound 560. The second electrical connectors 558 are in direct electrical connection with the electrical contacts 576 on the planar lower surface of the RDL 570. The second electrical connectors 558 may include, but are not limited to, vertical wire bonds, conductive material pillars, and the combination thereof.

An RDL is a multi-layered routing structure, which includes conductive patterns and electrical contacts in an upper surface and a lower surface, and conductive patterns in intermediate layer(s), for routing and electrical connection between the upper and the lower surfaces. Intermediate layer conductive patterns 578a and lower surface electrical contacts 576 of the RDL 570 are schematically shown in FIG. 5A.

Figure 5B:
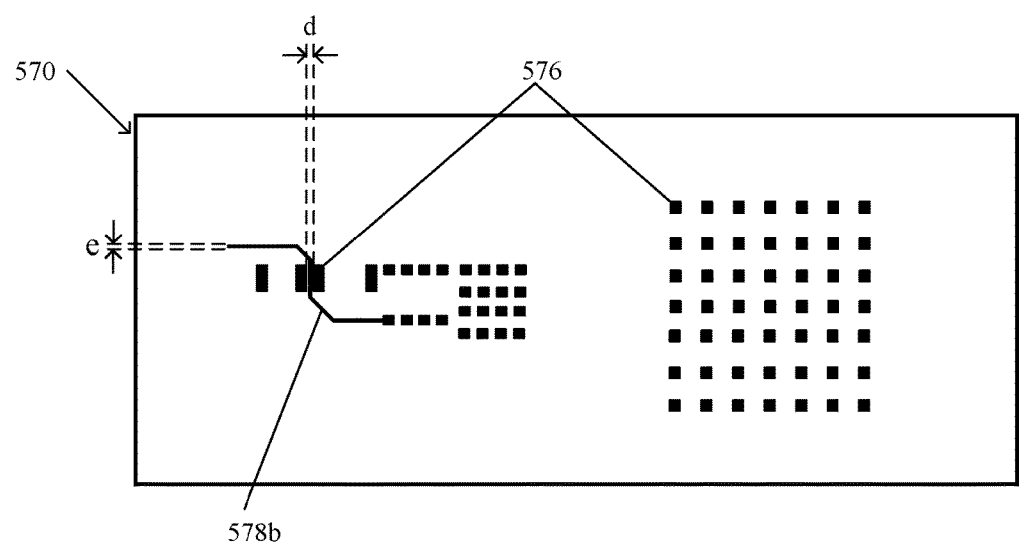
FIG. 5B is a cross-section view of the semiconductor package in FIG. 54A taken along line II-II.

FIG. 5B is a cross-section view of the semiconductor package in FIG. 5A taken along the line II-II. In one example, the lower surface of the RDL 570 includes lower surface electrical contacts 576 and lower surface conductive patterns 578b electrically connected with at least a portion of the lower surface electrical contacts 576. The lower surface conductive patterns 578b can pass through between a pair of closest lower surface electrical contacts 576. A smallest gap between the closest lower surface electrical contacts 576 is gap d. Generally, the RDL 570 can be formed by processes such as deposition (for example, PVD, CVD), forming vias, electroplating, electroless plating, masking, lithography, in which width e of the conductive patterns 578b can be smaller than 20 μm, or even smaller than 10 μm. In one example, the RDL 570 can be directly formed over the third planar surface 562 of the second molding compound 560 such that the lower surface electrical contacts 576 of the RDL 570 are in direct electrical contact with each of the conductive bumps 524a, 524b and 524d, each of the first electrical connectors 522c, and each of the second electrical connectors 558, without the need for SMT technique or a substrate. Therefore, the gap d of the lower surface electrical contacts 576 can be only slightly greater than the width e of the conductive patterns of the RDL 570, and thus can be smaller than 20 μm, or even smaller than 10 μm. Advantageously, the electrical connectors of the electronic elements and the semiconductor device in the semiconductor package 500 can be arranged more tightly with the use of the RDL 570, as compared to electrical connectors of electronic elements mounted by using a substrate or SMT technique.

In one example, types, numbers and arrangements of the electronic elements 520a, 520b, 520c and 520d, and materials for the second molding compound 560 are substantially the same as those described above with reference to corresponding embodiment, and detailed description thereof is thus omitted.

For the sake of simplicity, in the following description of a semiconductor package according to an embodiment with reference to FIG. 6-FIG. 11B, contents similar to embodiments described with reference to FIG. 5A-FIG. 5B are omitted.

Figure 6:
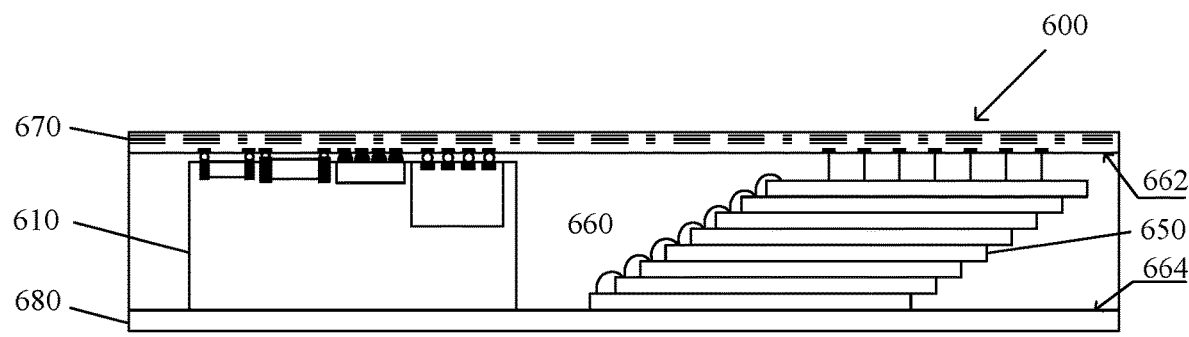
FIG. 6 is a cross-section side view illustrating a semiconductor package according to another embodiment.

FIG. 6 is a cross-section side view illustrating a semiconductor package 600 according to another embodiment. The semiconductor package 600 includes an integrated electronic element module 610; a semiconductor device 650; a second molding compound 660 encapsulating the integrated electronic element module 610 and the semiconductor device 650, the second molding compound 660 including a third planar surface 662 and an opposing fourth planar surface 664; an RDL 670 formed over the third planar surface 662 and used for electrical connection with the integrated electronic element module 610 and the semiconductor device 650; and a third molding compound 680 formed over the fourth planar surface 664. In one embodiment, the third molding compound 680 can further protect lower surfaces of the integrated electronic element module 610 and the semiconductor device 650, and can improve the structural integrity of the semiconductor package 600. Materials for the third molding compound 680 are substantially the same as those described above with reference to corresponding embodiments, and detailed description thereof is thus omitted. In one example, the first molding compound of the integrated electronic element module, the second molding compound and the third molding compound of the semiconductor package are made of the same material. In such case, stresses at interfaces between the first, the second, and the third molding compounds may be reduced or eliminated, and thus improving the structural strength and avoiding adverse effects due to difference in coefficients of thermal expansion and the like. In another example, two or three kinds of materials with different physical, chemical, or electrical performance parameters can also be used for the first, the second, and the third molding compound, thereby achieving expected effects, such as stress balance, electromagnetic interference shielding, eliminating warp or bending, and the like. The third molding compound 660 is optional, and may not be formed over the fourth planar surface, as shown in FIG. 5A and FIGS. 7-10.

Figure 7:
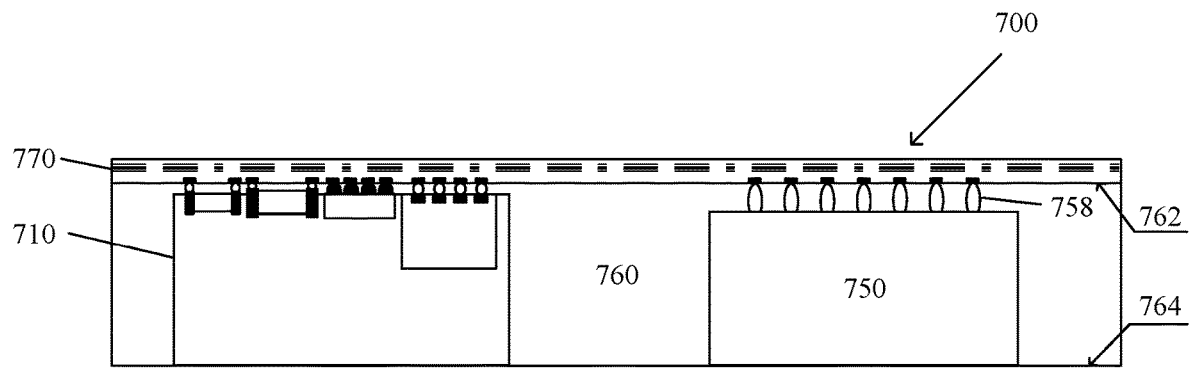
FIG. 7 is a cross-section side view illustrating a semiconductor package according to another embodiment.

FIG. 7 is a cross-section side view illustrating a semiconductor package 700 according to another embodiment. The semiconductor package 700 includes an integrated electronic element module 710; a semiconductor device 750; a second molding compound 760 encapsulating the integrated electronic element module 710 and the semiconductor device 750, the second molding compound 760 including a third planar surface 762 and an opposing fourth planar surface 764; an RDL 770 formed over the third planar surface 762 and used for electrical connection with the integrated electronic element module 710 and the semiconductor device 750. The semiconductor device 750 may be individual devices, including, but not limited to, a single chip, a single die, a single smaller semiconductor package. The semiconductor device 750 has second electrical connectors 758 extending upwards and in electrical connection with the RDL 770.

Figure 8:
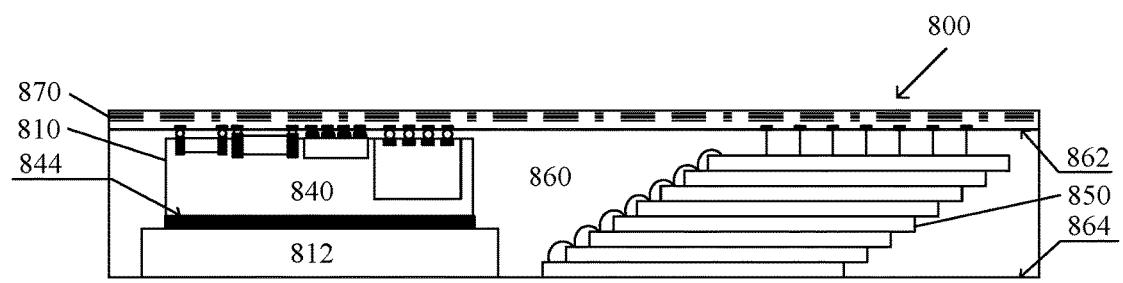
FIG. 8 is a cross-section side view illustrating a semiconductor package according to another embodiment.

FIG. 8 is a cross-section side view illustrating a semiconductor package 800 according to another embodiment. The semiconductor package 800 includes an integrated electronic element module 810; a spacer 812; a semiconductor device 850; a second molding compound 860 encapsulating the integrated electronic element module 810, the spacer 812, and the semiconductor device 850, the second molding compound 860 including a third planar surface 862 and an opposing fourth planar surface 864; and an RDL 870 formed over the third planar surface 862 and used for electrical connection with the integrated electronic element module 810 and the semiconductor device 850. In such case, a thickness of the integrated electronic element module 810 is smaller than the thickness of the second molding compound 860 of the semiconductor package 800. The spacer 812 is disposed beneath a second planar surface 844 of a first molding compound 840 of the integrated electronic element module 810. A sum of the thickness of the integrated electronic element module 810 and the thickness of the spacer 812, and a thickness of an optional adhering material layer therebetween substantially equals to the thickness of the second molding compound 860. In this way, an integrated electronic element module having a thickness smaller than a thickness of a semiconductor packages can be used along with spacers, thereby improving the application flexibility of the integrated electronic element module.

In embodiments in FIGS. 5A-8, the semiconductor devices and the integrated electronic element modules according to the present technology are disposed over the RDL in a side-by-side manner. As used herein, expression of two or more features disposed over a particular structure in a side-by-side manner is not referring to the upper/lower position of the two or more features and this particular structure, but rather indicates that the projections of the two or more features on this particular structure do not overlap with each other.

Figure 9:
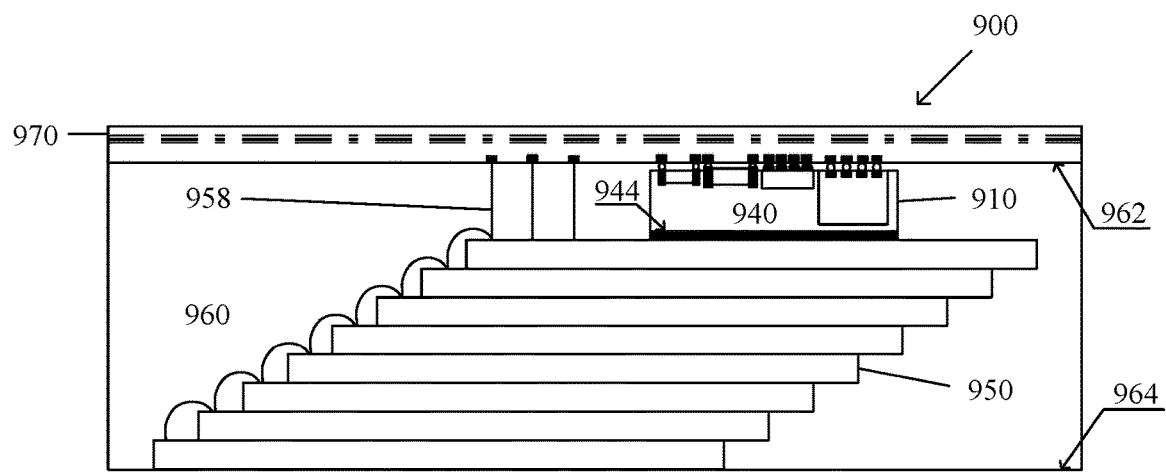
FIG. 9 is a cross-section side view illustrating a semiconductor package according to another embodiment.

FIG. 9 is a cross-section side view illustrating a semiconductor package 900 according to another embodiment. The semiconductor package 900 includes a semiconductor device 950; an integrated electronic element module 910; a second molding compound 960 encapsulating the integrated electronic element module 910 and the semiconductor device 950, the second molding compound 960 including a third planar surface 962 and an opposing fourth planar surface 964; an RDL 970 formed over the third planar surface 962 and electrically connected to the integrated electronic element module 910 and the semiconductor device 950. In one example, the integrated electronic element module 910 is stacked over the semiconductor device 950 with a second planar surface 944 of a first molding compound 940 of the integrated electronic element module 910. A sum of a thickness of the integrated electronic element module 910, a thickness of the semiconductor device 950, and a thickness of an optional adhering material layer substantially therebetween equals to that of the second molding compound 960 of the semiconductor package 900.

Figure 10:
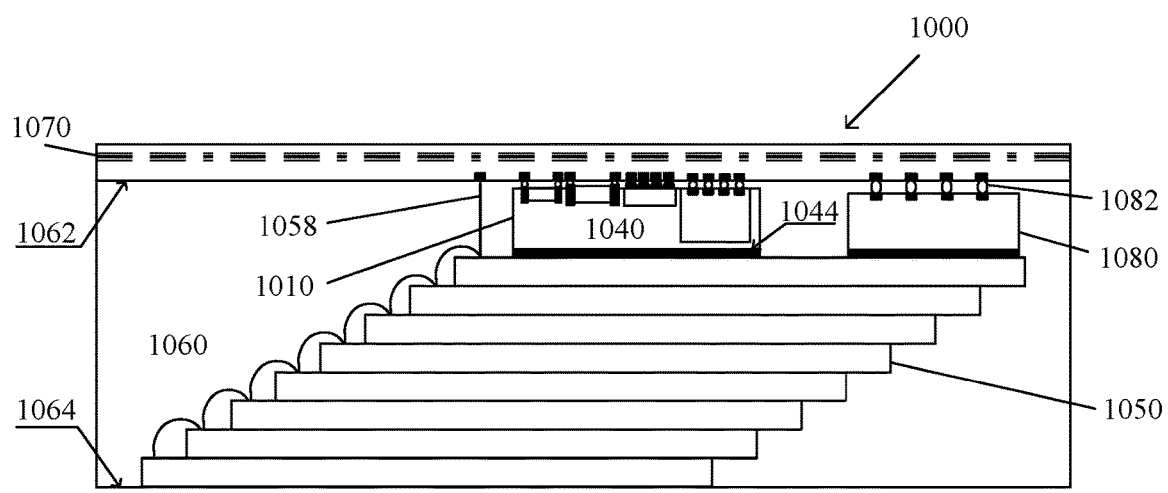
FIG. 10 is a cross-section side view illustrating a semiconductor package according to another embodiment.

FIG. 10 is a cross-section side view illustrating a semiconductor package 1000 according to another embodiment. The semiconductor package 1000 includes a semiconductor device 1050; an integrated electronic element module 1010; an additional element or device 1080; a second molding compound 1060 encapsulating the integrated electronic element module 1010, the semiconductor device 1050 and the additional element or device 1080, the second molding compound 1060 including a third planar surface 1062 and an opposing fourth planar surface 1064; and an RDL 1070 formed over the third planar surface 1062 and electrically connected to the integrated electronic element module 1010, the semiconductor device 1050, and the additional element or device 1080. In one example, the integrated electronic element module 1010 is stacked over the semiconductor device 1050 with a second planar surface 1044 of a first molding compound 1040 of the integrated electronic element module 1010. The additional element or device 1080 is also stacked over the semiconductor device 1050 with a lower surface (not labeled) thereof. The additional element or device 1080 has electrical connectors 1082 extending to the RDL 1070. The additional element or device 880 may include, but are not limited to, a chip, a die, a chip stack, a die stack, a passive device, a relatively smaller semiconductor package, an another integrated electronic element module and the combination thereof.

In one example, embodiments of the integrated electronic element module 510 arranged side-by-side with the semiconductor device, the spacer 812, the integrated electronic element module 910 stacked over the semiconductor device, and the additional element or device 1080 can be combined with each other to improve application flexibility.

Figure 11A:
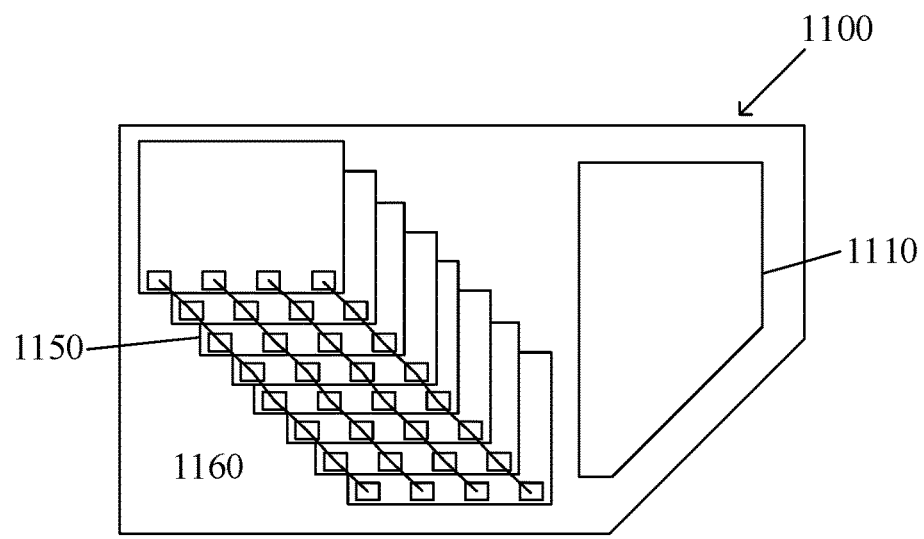
FIG. 11A is a top view illustrating a semiconductor package according to yet another embodiment.

FIG. 11A is a top view illustrating a semiconductor package 1100 according to yet another embodiment. For the sake of clarity, the illustration of an RDL of the semiconductor package 1100 is omitted in FIGS. 11A-11B. The semiconductor package 1100 includes a semiconductor device 1150; an integrated electronic element module 1110; a second molding compound 1160 encapsulating the semiconductor device 1150 and the integrated electronic element module 1110; and an RDL (not shown) formed on a surface of the second molding compound 1160. In one example, the semiconductor package 1100 can be a Secure Digital card (SD card, or microSD card) having a chamfered rectangular shape, and the semiconductor device 1150 can be a memory die stack.

Figure 11B:
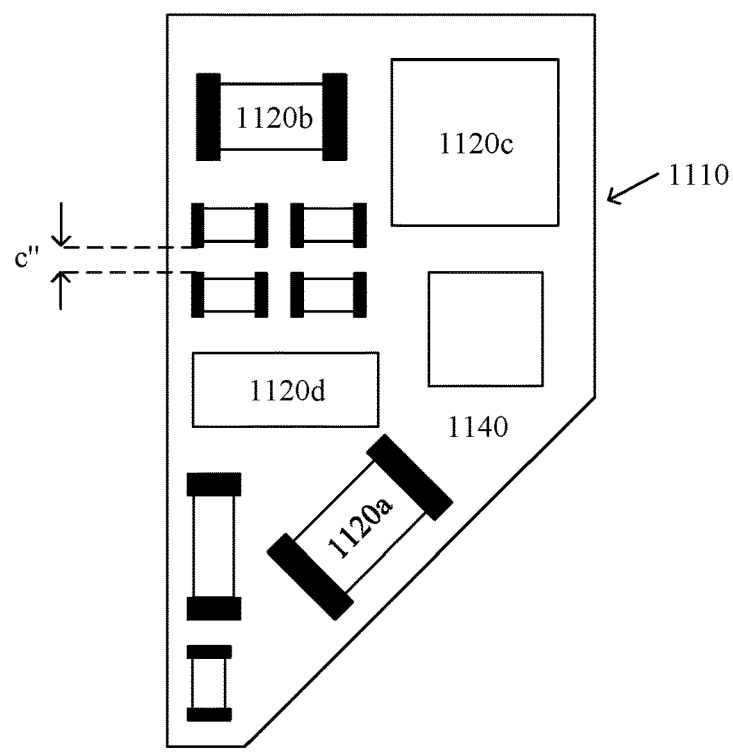
FIG. 11B is an enlarged top view illustrating an integrated electronic element module of the semiconductor package in FIG. 11A.

FIG. 11B is an enlarged top view illustrating an integrated electronic element module 1110 of the semiconductor package 1100 in FIG. 11A. In one example, a shape and a size of the customized integrated electronic element module 1110 are adapted for the design specification of the semiconductor package 1100. In one example, after the semiconductor device 1150 occupies a part of an area within the semiconductor package 1100, the integrated electronic element module 1110 is disposed in the remaining available are of the semiconductor package 1100, and can be configured to correspond to the chamfered shape of the semiconductor package 1100. As shown, an arrangement of the electronic elements 1120a, 1120b, 1120c and 1120d within the integrated electronic element module 1110 are at least partially based on area utilization ratio. In one example, a smallest gap between the closest adjacent first electrical connectors in the integrated electronic element module 1110 is a gap c", which is smaller than 20 µm, preferably smaller than 10 µm. In such case, more elements can be more tightly arranged in the available area using the integrated electronic element module 1110 customized for semiconductor package 1100, in order to provide higher performance (such as, larger capacitance) and more diverse functions (such as, management, auxiliary, communication, etc.).

Detailed description will now be made to a method for fabricating a semiconductor package according to an embodiment with reference to flow charts FIG. 12, FIG. 14 and schematic illustrations FIGS. 13A-13G, and 15A-15K. The semiconductor package includes an integrated electronic element module according to an embodiment. To this end, an integrated electronic element module is first provided.

Figure 12:
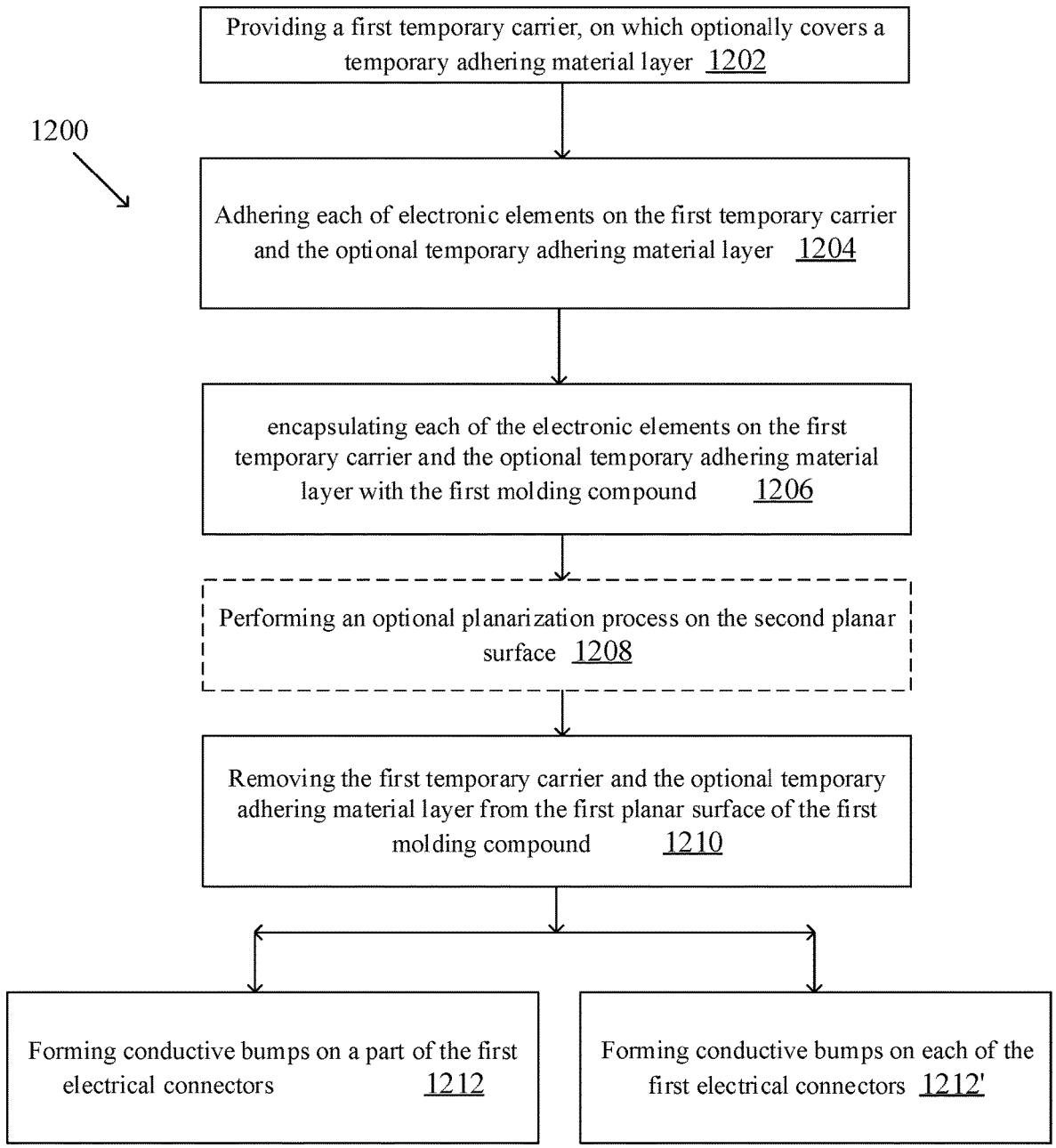
FIG. 12 is a flow chart schematically illustrating a method for providing the integrated electronic element module according to one embodiment.

FIG. 12 is a flow chart schematically illustrating a method for providing the integrated electronic element module according to one embodiment. FIGS. 13A-13G is an illustration schematically illustrating the integrated electronic element module during various steps of the fabrication process according to one embodiment.

Figure 13A:
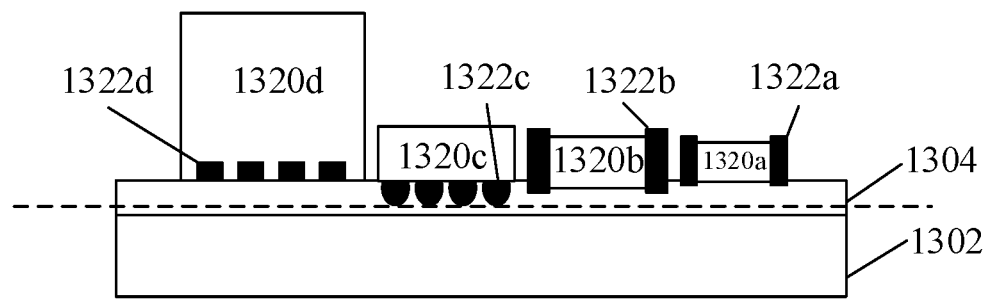
FIGS. 13A-13G are illustrations schematically illustrating the integrated electronic element module during various steps of the fabrication process according to one embodiment.
Figure 14:
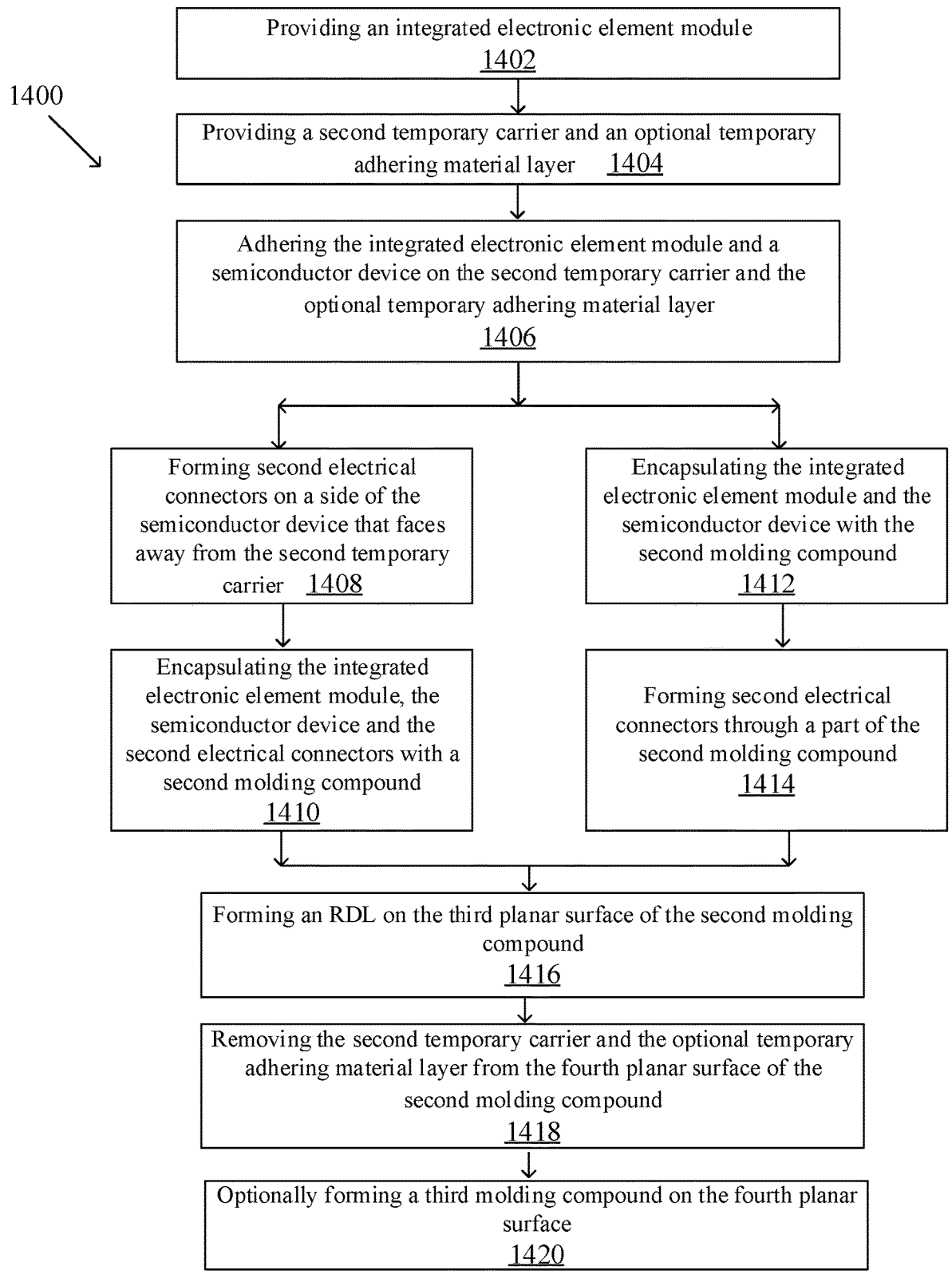
FIG. 14 is a flow chart schematically illustrating a method for fabricating a semiconductor package according to one embodiment.

As shown in FIG. 13A, in step 1202, a first temporary carrier 1302 is provided, on which an optional temporary adhering material layer 1304 is provided. The first temporary carrier 1302 is a material layer having a certain rigidity and a planar surface. The first temporary carrier 1302 will be removed in a subsequent step, and thus can be preferably formed by cheaper materials, such as, stainless steel, silica glass, etc. Alternatively, the first temporary carrier 1302 can also be made of a silicon wafer. The temporary adhering material layer 1304 is made by a temporary adhering material to facilitate subsequent removal together with the first temporary carrier 1302. As used herein, the temporary adhering material refers to an adhering material that can be relatively readily removed by a physical or chemical method, such as stripping, dissolving, reaction, etc.

In step 1204, each of electronic elements 1320a, 1320b, 1320c and 1320d is adhered on the first temporary carrier 1302 and the optional temporary adhering material layer 1304 by a device, such as a chip shooter, a pick-and-place robot and the like. Each of the electronic element 1320a, 1320b, 1320c and 1320d has first electrical connectors 1322a, 1322b, 1322c and 1322d. Each of the first electrical connectors 1322a, 1322b, 1322c and 1322d is in direct contacted with the first temporary carrier 1302 or the optional temporary adhering material layer 1304, and is optionally partly embedded into the optional temporary adhering material layer 1304. Alternatively, the first temporary carrier 1302 can also temporarily secure the electronic elements 1320a, 1320b, 1320c and 1320d in an adsorption, vacuum manner or the like. Depths of the electronic elements 1320a, 1320b, 1320c and 1320d embedding into the first temporary adhering material layer 1304 correspond to the heights of the electronic elements 1320a, 1320b, 1320c and 1320d in the fabricated integrated electronic element module 1310 with respect to the first planar surface 1342 of the first molding compound 1340, as will be described hereafter in more detail. The first temporary adhering material layer 1304 is optional. In case where none of the first electrical connectors of the electronic elements protrude from the lower surfaces of the electronic elements (such as, the electronic element 1320d shown in FIG. 13A), it is not necessary to provide the first temporary adhering material layer 1304. In such case, in the formed integrated electronic element module 1310, all first electrical connectors of all electronic elements are substantially coplanar with the first planar surface 1342 of the first molding compound 1340. The electronic elements 1320a, 1320b, 1320c and 1320d may be substantially the same as those described above with reference to corresponding embodiments, and detailed description thereof is thus omitted.

Figure 13B:
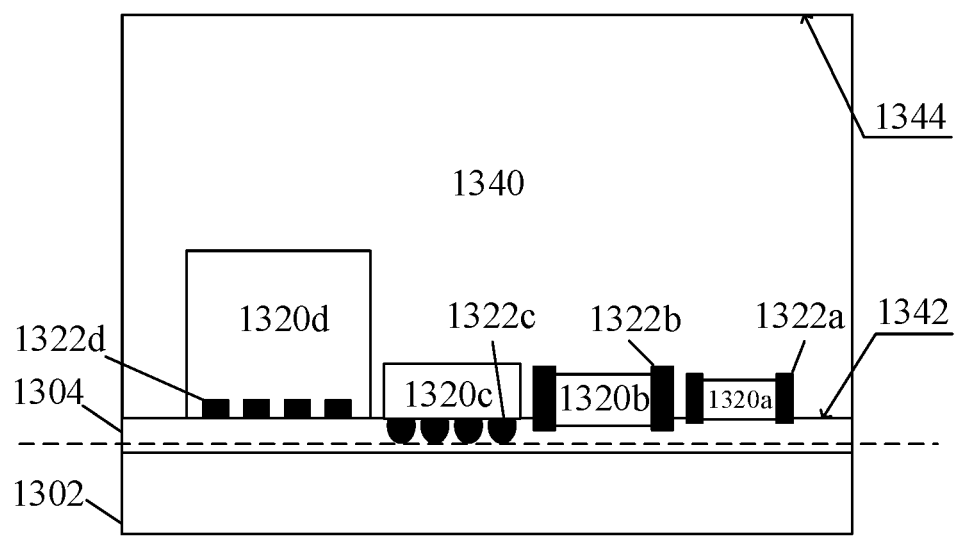

In step 1206, as shown in FIG. 13B, each of the electronic elements 1320a, 1320b, 1320c and 1320d is encapsulated on the first temporary carrier 1302 and the optional temporary adhering material layer 1304 with the first molding compound 1340. The first molding compound 1340 forms a first planar surface 1342 abutting the first temporary carrier 1302 or the optional temporary adhering material layer 1304, and an opposing second planar surface 1344. By way of example, such encapsulating process can include injecting melted molding compound into a mould surrounding the electronic elements 1320a, 1320b, 1320c and 1320d over the first temporary carrier 1302 and the optional temporary adhering material layer 1304, cooling and curing the molding compound, and removing the mould. Examples of materials of the first molding compound 1340 are substantially the same as those described above with reference to corresponding embodiments, and detailed description thereof is thus omitted.

Figure 13C:
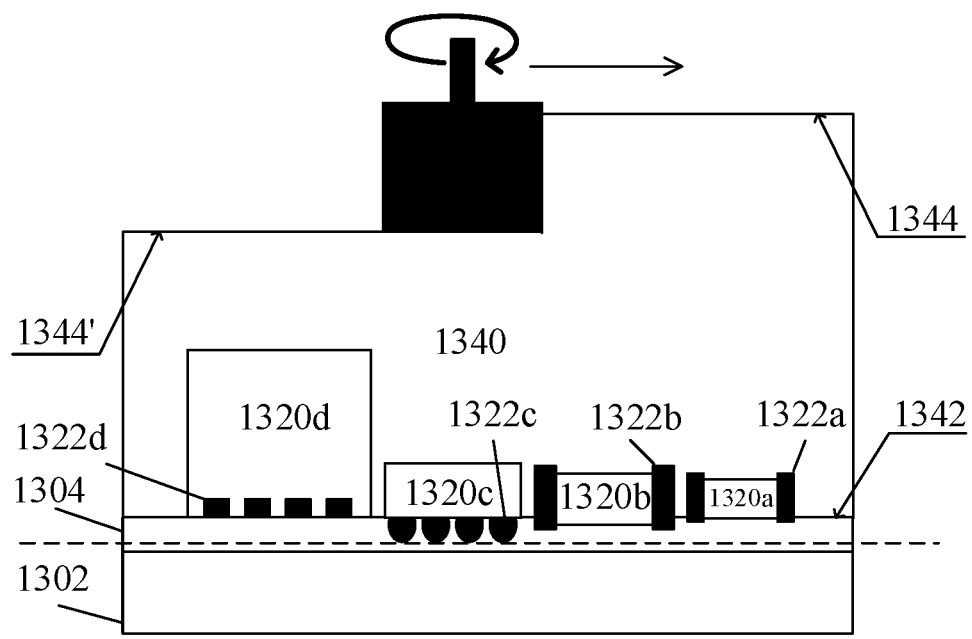

In step 1208, as shown in FIG. 13C, an optional planarization process (such as chemical mechanical planarization, CMP) is performed on the second planar surface 1344 to thin the first molding compound 1340 to a desired thickness, and to expose a new second planar surface 1344'. In one example, the planarization process of step 1208 is optional and may not be performed (as indicated by a dash-lined block representing step 1208 in the flow chart FIG. 12). Alternatively, in one example, a thickness of the first molding compound 1340 can also be directly formed to a desired thickness in step 1206, without performing step 1208, and directly proceeding to step 1210 after step 1206.

Figure 13D:
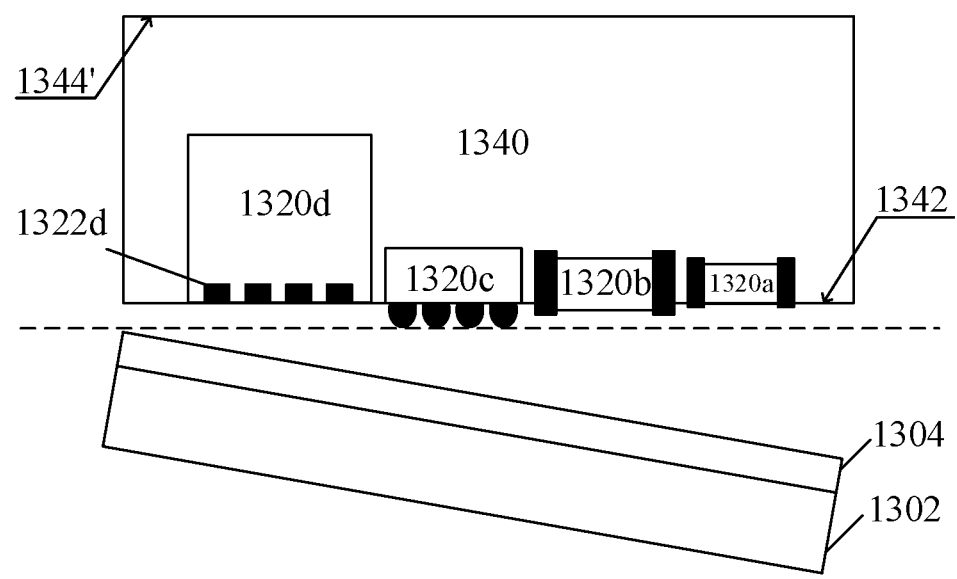

In step 1210, as shown in FIG. 13D, the first temporary carrier 1302 and the optional temporary adhering material layer 1304 are removed from the first planar surface 1342 of the first molding compound 1340 to expose each of the first electrical connectors 1322a, 1322b, 1322c and 1322d of each of the electronic elements 1320a, 1320b, 1320c and 1320d on the first planar surface 1342. In one example, the removal process is associated with the specific first temporary carrier 1302 and the optional temporary adhering material layer 1304. For example, in a case where the temporary adhering material layer 1304 can lose stickiness or melt at an elevated temperature, the first temporary carrier 1302 and the temporary adhering material layer 1304 can be removed by heating.

Figure 13E:
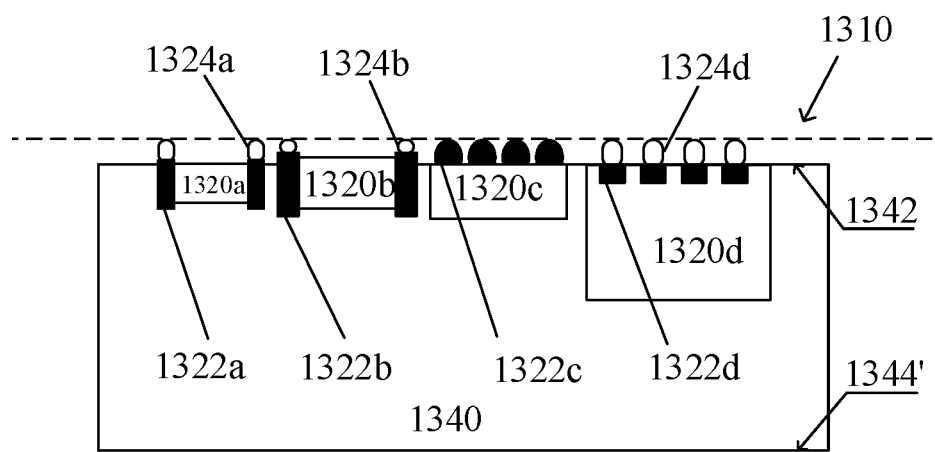

Next, in one implementation, in step 1212, as shown in FIG. 13E, the structure resulted from step 1210 is flipped, and conductive bumps are subsequently formed on a part of the first electrical connectors 1322a, 1322b, 1322c and 1322d. In one example, conductive bumps 1324a, 1324b and 1324d are formed on the first electrical connectors 1322a, 1322b and 1322d of the electronic elements 1320a, 1320b and 1320d, whereas no conductive bumps are formed on the first electrical connectors 1322c of the electronic elements 1320c. In such case, top surfaces of the electrical connectors 1322c and conductive bumps 1324a, 1324b and 1324d are coplanar with each other. In other words, heights of the electrical connectors 1322c and the conductive bumps 1324a, 1324b and 1324d protruding with respect to the first planar surface 1342 are equal to each other, as shown by a dash line in FIG. 13E. Therefore, the conductive bumps 1324a, 1324b and 1324d and the first electrical connectors 1322c are suitable for being directly connected with electrical connections on a planar surface, such as an RDL, of the semiconductor package, as will be described hereafter in more detail.

In an alternative implementation, in step 1212', the structure resulted from step 1210 is flipped, conductive bumps 1324a, 1324b, 1324c and 1324d (not shown in the illustration) are formed on each of the first electrical connectors 1322a, 1322b, 1322c and 1322d of the electronic elements 1320a, 1320b, 1320c and 1320d, such that conductive bumps 1324a, 1324b, 1324c and 1324d are all coplanar with each other. In other words, heights of the conductive bumps 1324a, 1324b, 1324c and 1324d protruding with respect to the first planar surface 1342 are all equal to each other. Therefore, the conductive bumps 1324a, 1324b, 1324c and 1324d are suitable for being directly connected with electrical connections on a planar surface, such as an RDL, of the semiconductor package, as will be described hereafter in more detail.

The conductive bumps may be substantially the same as those described above with reference to corresponding embodiments, and detailed description thereof is thus omitted.

Figure 13F:
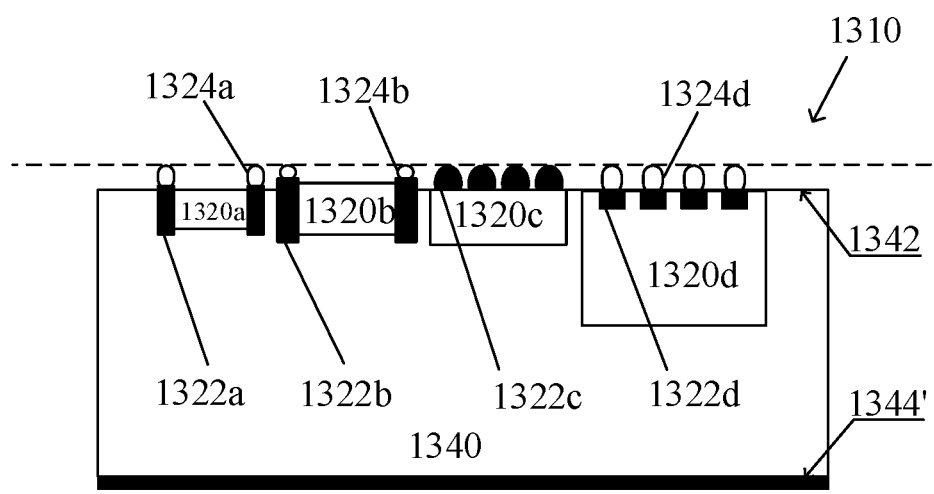

Optionally, as shown in FIG. 13F, an adhering material layer (not labelled), such as a die attach film (DAF), is provided on the second planar surface 1344' (or 1344) of the first molding compound 1340 of the integrated electronic element module 1310 resulted from step 1212 or step 1212', in order to be subsequently adhered to structures such as the semiconductor device 710 shown in FIG. 7, the spacer 812 shown in FIG. 8, etc. In one example, providing the adhering material layer is optional and may be omitted.

Figure 13G:
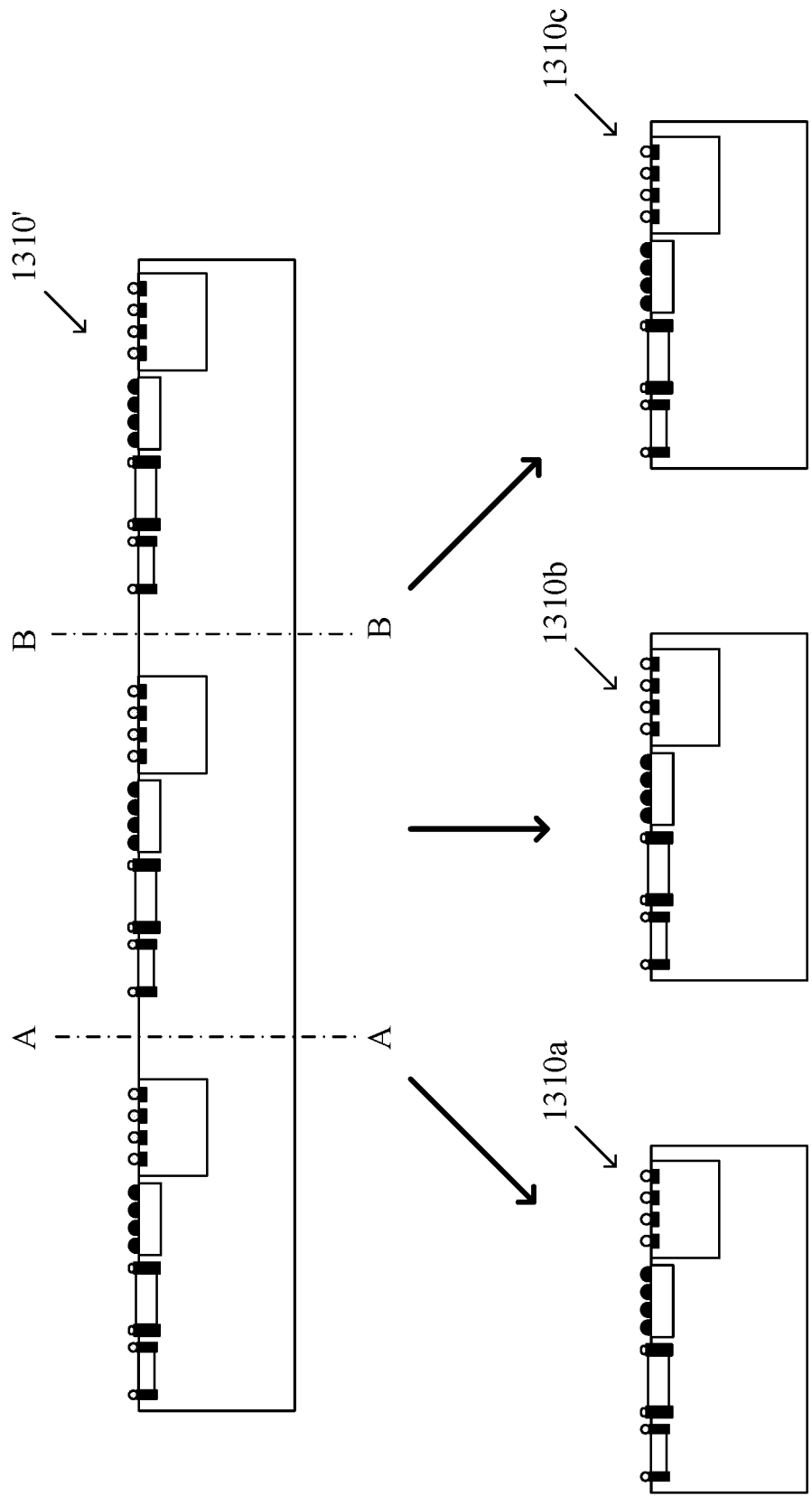

Although for the sake of simplicity, the steps of the method for providing the integrated electronic element module 1310 are shown as providing a single integrated electronic element module 1310 in FIG. 13A-13F, it is also possible to simultaneously provide a plurality of integrated electronic element modules 1310 by a panel-level process and a subsequent singulation process. As shown in FIG. 13G, a first temporary carrier and an optional temporary adhering material layer with sizes corresponding to a plurality of integrated electronic element module 1310 can be provided. The above steps 1202-1212 (1212') can be performed to form a panel of integrated electronic element modules 1310' corresponding to a joined plurality of integrated electronic element modules 1310. Subsequently, the panel of integrated electronic element modules 1310' is singulated into a plurality of separated integrated electronic element modules 1310 by a singulation process along kerf areas shown by dash lines A-A and B-B in FIG. 13G. The singulation process may include, but are not limited to, sawing, water jet cutting, stealth laser, chemical etching, lithography, etc. In another example, the singulation process may also be performed before step 1212 or 1212'.

In the example shown in FIGS. 13A-13G, a process of providing the integrated electronic element module 1310 substantially similar to the integrated electronic element module 300 of FIG. 3 is illustrated, however, the process is also suitable for providing integrated electronic element modules corresponding to embodiments in FIG. 4A or other possible embodiments that are not shown.

After providing the integrated electronic element module 1310 according to the present technology, the integrated electronic element module is used for fabricating a semiconductor package according to an embodiment. FIG. 14 is a flow chart schematically illustrating a method for fabricating a semiconductor package according to one embodiment. FIG. 15A-15K is an illustration schematically illustrating a semiconductor package during various steps of the fabrication process according to one embodiment.

In step 1402, an integrated electronic element module 1510 according to an embodiment is provided by steps described with reference to FIG. 12-FIG. 13G. The integrated electronic element module 1510 shown in FIG. 15A-FIG. 15K and the above described integrated electronic element module 1310 are substantially similar, and the detailed description thereof will be thus omitted.

Figure 15A:
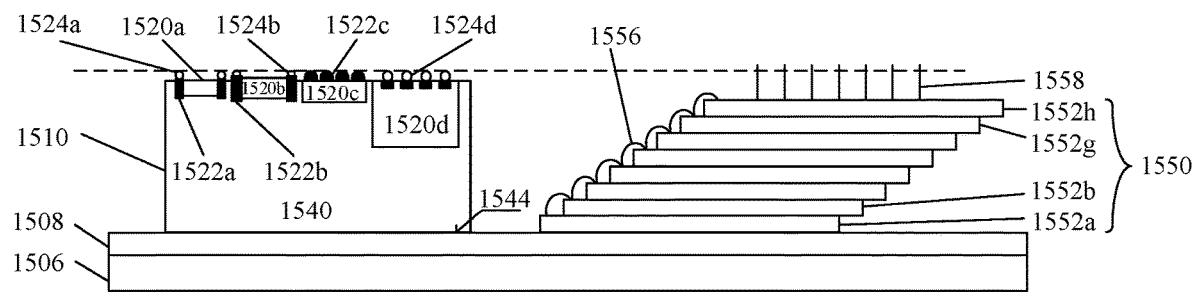
FIGS. 15A-15K are illustrations schematically illustrating a semiconductor package during various steps of the fabrication process according to one embodiment of the present technology.

In step 1404, as shown in FIG. 15A, a second temporary carrier 1506 and an optional temporary adhering material layer 1508 are provided. The second temporary carrier 1506 and the optional temporary adhering material layer 1508 are substantially the same as those described above with reference to corresponding embodiments, and detailed description thereof is thus omitted.

In step 1406, as shown in FIG. 15A, the integrated electronic element module 1510 and a semiconductor device 1550 are adhered on the second temporary carrier 1506 and the optional temporary adhering material layer 1508 by a device such as a chip shooter, a pick-and-place robot. A second planar surface 1544 (or a planarized second planar surface 1544') of a first molding compound 1540 of the integrated electronic element module 1510 abuts the second temporary carrier 1506 or the optional temporary adhering material layer 1508. In one example, the semiconductor device 1550 is a die stack. The die stack can be formed by stacking dies 1552a-1552h one-by-one on the second temporary carrier 1506 or the optional temporary adhering material layer 1508, or by integrally adhering a pre-stacked die stack on the second temporary carrier 1506 or the optional temporary adhering material layer 1508. Electrical interconnects 1556, such as wire bonds, are formed between the dies 1522a-1522h. In a case of a pre-stacked die stack, electrical interconnects 1556 can be formed before or after adhering the die stack to the second temporary carrier 1506 or the optional temporary adhering material layer 1508. In various examples, the number of dies in the die stack is only for the purpose of illustration, and the die stack can include more or less dies in other embodiments.

Next, in one implementation, with reference to FIGS. 15A-15D and step 1408, 1410, second electrical connectors 1558 of the semiconductor device 1550 and the second molding compound 1560 of the semiconductor package 1500 are formed. In step 1408, as shown in FIG. 15A, second electrical connectors 1558 are formed on a side of the semiconductor device 1550 that faces away from the second temporary carrier 1506 (i.e., extending upwards in FIG. 15A). A height of each of the second electrical connectors 1558 is not lower than that of the top surface of the integrated electronic element module 1510, as shown by a dash line in FIG. 15A. The second electrical connectors 1558 may include, but are not limited to, vertical wire bonds, conductive material pillars and the combination thereof.

Figure 15B:
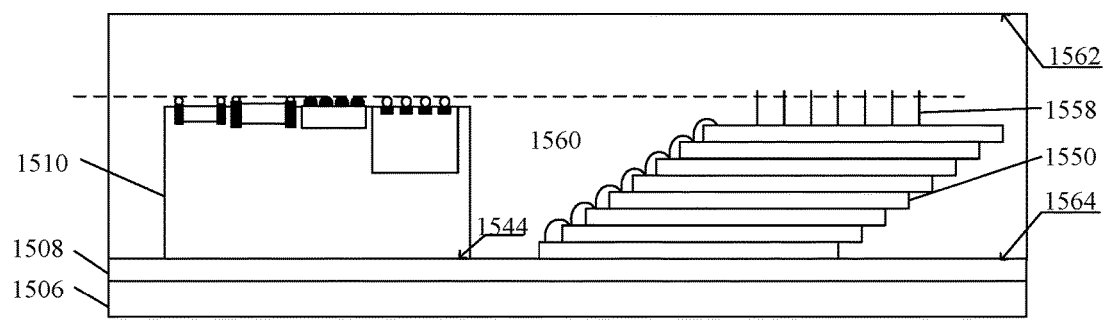

In step 1410, as shown in FIG. 15B, the integrated electronic element module 1510, the semiconductor device 1550 and the second electrical connectors 1558 are encapsulated with the second molding compound 1560. The second molding compound 1560 forms a fourth planar surface 1564 abutting the second temporary carrier 1506 or the optional temporary adhering material layer 1508, and an opposing third planar surface 1562. A height of the third planar surface 1562 of the second molding compound 1560 is not lower than that of the top surface of the integrated electronic element module 1510, as shown by the dash line in FIG. 15B, and also is not lower than heights of tops of the second electrical connectors 1558.

Figure 15C:
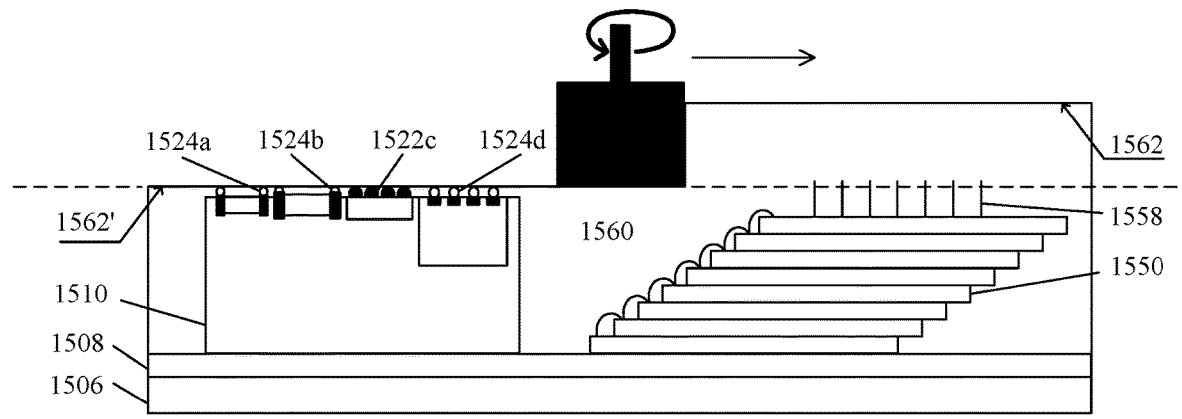
Figure 15D:
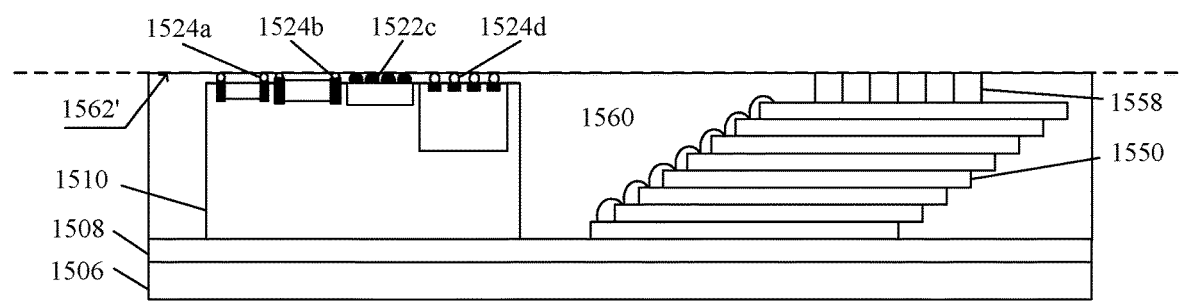

As shown in FIG. 15C, an optional planarization process is optionally performed to the third planar surface 1562 of the second molding compound 1560 along a plane coplanar with the top surface of the integrated electronic element module 1510 (shown by the dash line in FIG. 15C), in order to thin the second molding compound 1560 and to expose a new third planar surface 1562'. The planarization process may be substantially the same as those described above with reference to corresponding embodiments, and detailed description thereof is thus omitted. After the planarization process, as shown in FIG. 15D, a new third planar surface 1562' is exposed by thinning the second molding compound 1560. Each of the conductive bumps 1524a, 1524b, 1524d and the first electrical connectors 1522c of the integrated electronic element module 1510, and second electrical connectors 1558 of the semiconductor device 1550 are exposed on the third planar surface 1562'. Therefore, the conductive bumps 1524a, 1524b and 1524d, the first electrical connectors 1522c, and the second electrical connectors 1558 are suitable for being directly connected with electrical connections on a planar surface, such as an RDL, of a semiconductor package, as will be described hereafter in more detail.

In one implementation, the planarization process is optional and may not be performed. In a case where heights of the second electrical connectors 1558 are just equal to that of the top surface of the integrated electronic element module 1510, and a height of third planar surface 1562 of the initially formed second molding compound 1560 is just equal to that of the top surface of the integrated electronic element module 1510, the planarization process may not be performed. In such case, the conductive bumps 1524a, 1524b, 1524d, first electrical connectors 1522c, and second electrical connectors 1558 of the semiconductor device 1550 are all exposed on the initially formed third planar surface 1562, and are all coplanar with the third planar surface 1562.

Figure 15E:
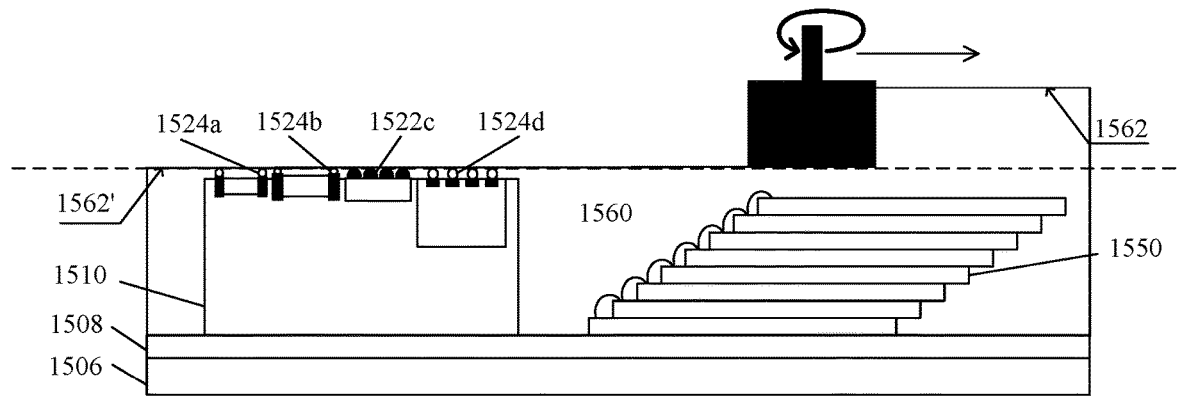
Figure 15F:
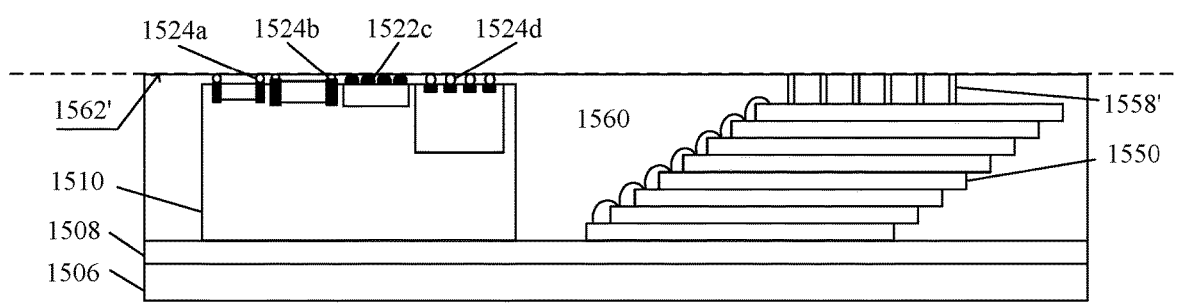
Figure 15G:
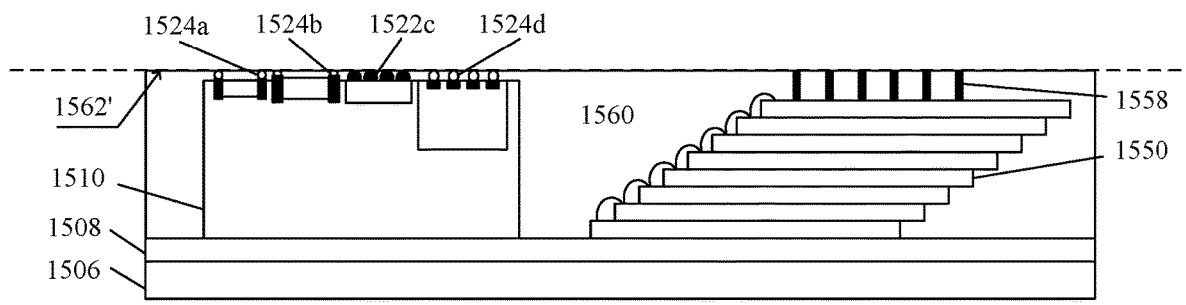

In an alternative implementation, with reference to FIGS. 15E-15G and steps 1412, 1414, the second electrical connectors 1558 of the semiconductor device 1550 and the second molding compound 1560 of the semiconductor package 1500 are formed. In step 1412, as shown in FIG. 15E, the integrated electronic element module 1510 and the semiconductor device 1550 are encapsulated with the second molding compound 1560. The second molding compound 1560 forms a fourth planar surface 1564 abutting the second temporary carrier 1506 or the optional temporary adhering material layer 1508, and an opposing third planar surface 1562. Then, an optional planarization process is optionally performed on the third planar surface 1562 of the second molding compound 1560, such that the conductive bumps 1524a, 1524b, 1524d, and the first electrical connectors 1522c in the integrated electronic element module 1510 are all exposed on the planarized third planar surface 1562'. In an alternative implementation, the planarization process shown in FIG. 15E is optional and may not be performed. The second molding compound 1560 can be initially formed to just expose all of the conductive bumps 1524a, 1524b, 1524d, and first electrical connectors 1522c of the integrated electronic element module 1510 without planarization process.

In step 1414, as shown in FIG. 15F, vias 1558' are formed through a part of the second molding compound 1560 from the new third planar surface 1562' (or 1562). The vias 1558' extend to electrical contacts (not shown) on an upper surface of the semiconductor device 1550. The vias 1558' can be formed by any suitable technique in the art, such as through-molding-vias (TMVs) and the like. Then, as shown in FIG. 15G, conductive materials are applied in the vias 1558' to form conductive vias as the second electrical connectors 1558. In such case, the conductive vias route the electrical contacts on the upper surface of the semiconductor device 1550 to the third planar surface 1562' (or 1562), and are coplanar with the third planar surface 1562' (or 1562).

Figure 15H:
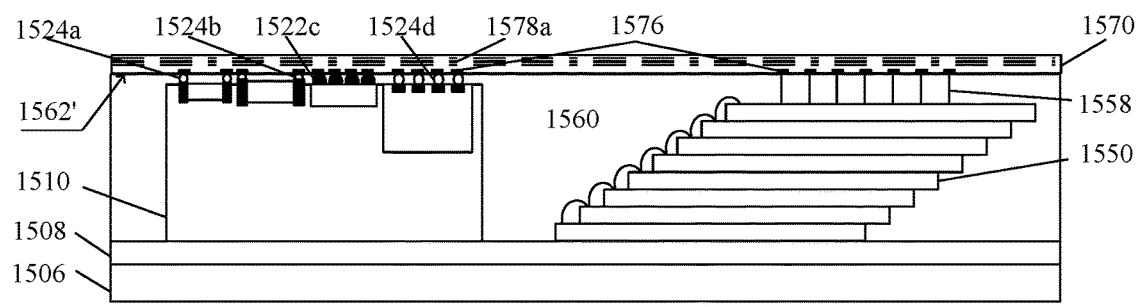

Next, based on the structure resulted from FIG. 15D or FIG. 15G, in step 1416, as shown in FIG. 15H, an RDL 1570 is formed over the third planar surface 1562 (or 1562') of the second molding compound 1560. The RDL 1570 can be formed layer-by-layer by, for example, deposition (for example, PVD, CVD), forming vias, electroplating, electroless plating, masking, lithography and other processes. Conductive contacts 1576 on a lower surface of the RDL 1570 is in electrical connection with each of the conductive bumps 1524a, 1524b and 1524d, first electrical connectors 1522c of the integrated electronic element module 1510, and the second electrical connectors 1558 of the semiconductor device 1550 at the third planar surface 1562 (or 1562'). As described above, the RDL 1570 also includes lower surface conductive patterns 578b in electrical connection with at least a part of the lower surface conductive contacts 1576, intermediate layer conductive patterns 1578a for routing the lower surface conductive contacts 1576 to the top layer, and top layer electrical connection structures (not shown, such as BGA, contact fingers and other electrical connection structures known in the art), for electrical connection to external of the semiconductor package 1500.

Figure 15I:
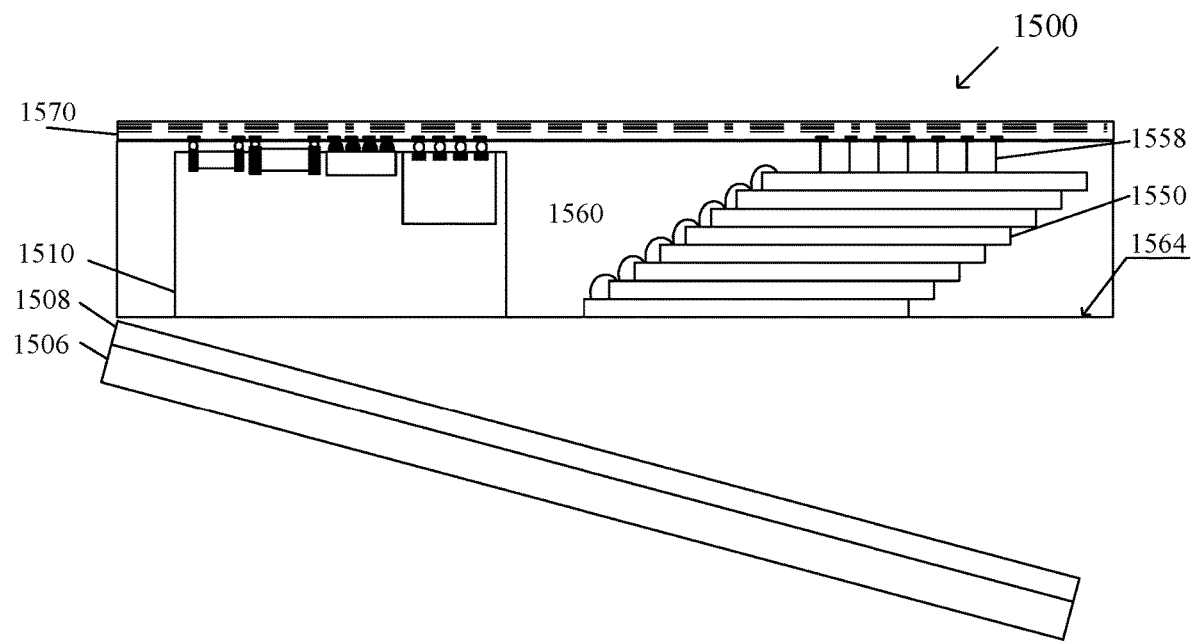

In step 1418, as shown in FIG. 15I, the second temporary carrier 1506 and the optional temporary adhering material layer 1508 are removed from the fourth planar surface 1564 of the second molding compound 1560 to obtain the completed semiconductor package 1500. The method for removing the second temporary carrier 1506 and the optional temporary adhering material layer 1508 may be substantially the same as those described above with reference to corresponding embodiments, and detailed description thereof is thus omitted.

Figure 15J:
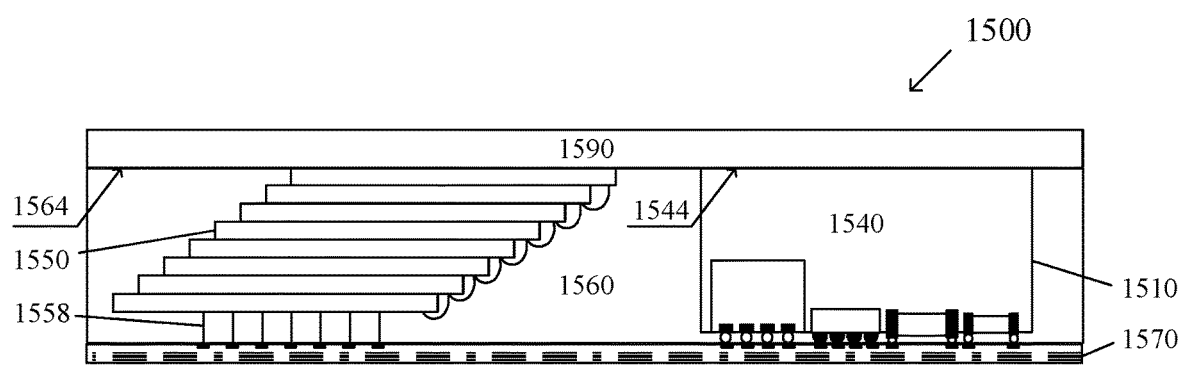

In an optional step 1420, as shown in FIG. 15J, the semiconductor package 1500 resulted from step 1418 is flipped, and an optional third molding compound 1590 is optionally applied on the fourth planar surface 1564 of the second molding compound 1560 to cover the fourth planar surface 1564, the second planar surface 1544 of the first molding compound 1540 of the integrated electronic element module 1510, and the exposed bottom surface of the semiconductor device 1550. The third molding compound 1590 further protects the integrated electronic element module 1510 and the semiconductor device 1550, and improves structural integrity.

Figure 15K:
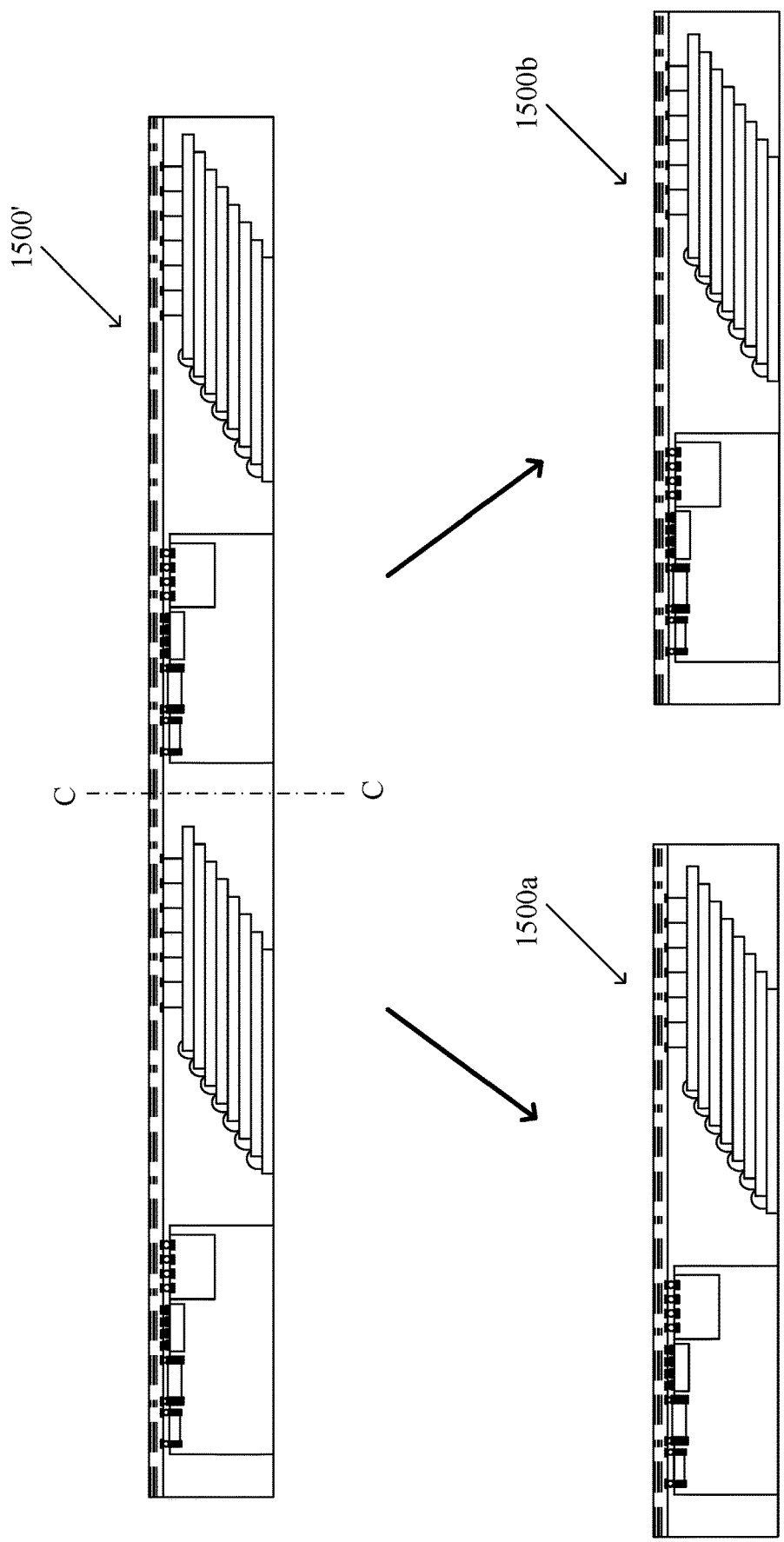

Although in FIGS. 15A-15K, for the sake of simplicity, the steps of method for fabricating the semiconductor package 1500 are shown as fabricating a single semiconductor package 1500, it is also possible to fabricate a plurality of semiconductor packages 1500 simultaneously by panel-level process and subsequent singulation process. As shown in FIG. 15K, a second temporary carrier and an optional temporary adhering material layer corresponding to a size of a plurality of semiconductor packages 1500 can be provided. The steps 1402-1420 as described above can be performed to form a panel of semiconductor packages 1500' corresponding to a joined plurality of semiconductor packages 1500. Subsequently, the panel of semiconductor packages 1500' is singulated into a plurality of separated semiconductor packages 1500 by a singulation process along a kerf areas shown by the dash line C-C in FIG. 15K. The singulation process are substantially the same as those described above with reference to corresponding embodiments, and detailed description thereof is thus omitted.

Although in FIGS. 15A-FIG. 15K, the semiconductor package 1500 is shown to be fabricated using an integrated electronic element module substantially similar to the integrated electronic element module 300 in FIG. 3A, however, it should be understood that the integrated electronic element modules corresponding to embodiments in FIG. 4A or other possible embodiments that are not shown are also suitable for fabricating the semiconductor package according to an embodiment. In addition, in FIGS. 15A-FIG. 15K, the semiconductor package 1500 is shown to be fabricated using a die stack as the semiconductor device, however, it should be understood that other embodiments of semiconductor devices, such as, one or more chips, one or more single dies, a chip stack, a die stack, a relatively smaller semiconductor package and the combination thereof, are also suitable for fabricating the semiconductor package according to an embodiment.

According to one embodiment, a substrate-less integrated electronic element module for a semiconductor package comprises: at least two electronic elements, each of the at least two electronic elements having first electrical connectors; and a first molding compound encapsulating the at least two electronic elements, the first molding compound comprising a first planar surface and an opposing second planar surface of the integrated electronic element module. Each of the first electrical connectors is directly exposed on the first planar surface of the integrated electronic element module.

In one embodiment, the at least two electronic elements comprise a combination of one or more of the following: a multi-layered ceramic capacitor, a silicon-based capacitor, a resistor, an inductor, an application specific integrated circuit die, a general purpose integrated circuit die, a wafer-level chip-scale package (WLCSP), and a quad flat no-lead package low dropout (QFN/LDO).

In one embodiment, the integrated electronic element module further comprises conductive bumps formed only on a part of the first electrical connectors. Top surfaces of the conductive bumps and top surfaces of the first electrical connectors without the conductive bumps are formed thereon are all coplanar with each other.

In one embodiment, the integrated electronic element module further comprises conductive bumps formed on each of the first electrical connectors. Top surfaces of the conductive bumps are all coplanar with each other.

In one embodiment, the first electrical connectors have a gap smaller than 10 μm between closest adjacent first electrical connectors.

According to one embodiment, a semiconductor package comprises: a substrate-less integrated electronic element module, comprising: at least two electronic elements, each of the at least two electronic elements having first electrical connectors; and a first molding compound encapsulating the at least two electronic elements, the first molding compound comprising a first planar surface and an opposing second planar surface; a semiconductor device comprising second electrical connectors; a second molding compound encapsulating the integrated electronic element module and the semiconductor device, the second molding compound comprising a third planar surface and an opposing fourth planar surface, the third planar surface being closer to the first planar surface than the second planar surface; and a redistribution layer formed over the third planar surface. Each of the first electrical connectors is directly exposed on the first planar surface, and is electrically connected to the redistribution layer. Each of the second electrical connectors of the semiconductor device extends to the third planar surface, and is electrically connected to the redistribution layer.

In one embodiment, the semiconductor package is substrate-less.

In one embodiment, the at least two electronic elements comprise a combination of one or more of the following: a multi-layered ceramic capacitor, a silicon-based capacitor, a resistor, and inductor, an application specific integrated circuit die, a general purpose integrated circuit die, a wafer-level chip-scale package (WLCSP), and a quad flat no-lead package low dropout (QFN/LDO).

In one embodiment, the integrated electronic element module further comprises conductive bumps formed only on a part of the first electrical connectors. Top surfaces of the conductive bumps and top surfaces of each of the first electrical connectors without conductive bumps formed thereon are all coplanar with each other.

In one embodiment, the integrated electronic element module further comprises conductive bumps formed on each of the first electrical connectors. Top surfaces of the conductive bumps are all coplanar with each other.

In one embodiment, the first electrical connectors have a gap smaller than 10 μm between closest adjacent first electrical connectors.

In one embodiment, the semiconductor device comprises a plurality of stacked memory dies.

In one embodiment, the integrated electronic element module and the semiconductor device are disposed over the redistribution layer in a side-by-side manner.

In one embodiment, a thickness of the integrated electronic element module and the second molding compound of the semiconductor package have the same thickness.

In one embodiment, the semiconductor package further comprises a spacer disposed on a side of the integrated electronic element module facing away from the redistribution layer. A sum of a thickness of the integrated electronic element module and a thickness of the spacer equals to a thickness of the second molding compound of the semiconductor package.

In one embodiment, the integrated electronic element module is stacked over the semiconductor device.

In one embodiment, the semiconductor package further comprises a third molding compound formed on the fourth planar surface.

According to one embodiment, a method for fabricating a semiconductor package comprises: providing a substrate-less integrated electronic element module, comprising: providing a first temporary carrier; adhering at least two electronic elements on the first temporary carrier, each of the at least two electronic elements having first electrical connectors, and each of the first electrical connectors being in contact with the first temporary carrier; encapsulating the at least two electronic elements with a first molding compound, the first molding compound forming a first planar surface and an opposing second planar surface, the first planar surface abutting the first temporary carrier; removing the encapsulated integrated electronic element module from the first temporary carrier such that each of the first electrical connectors is directly exposed on the first planar surface; providing a second temporary carrier; adhering the integrated electronic element module and the semiconductor device on the second temporary carrier, encapsulating the integrated electronic element module and the semiconductor device with a second molding compound. The semiconductor device is formed with second electrical connectors, and the first electrical connectors and the second electrical connectors face away from the second temporary carrier, and the second molding compound forms a third planar surface and an opposing fourth planar surface, and the third planar surface is closer to the first planar surface than the second planar surface. Each of the first electrical connectors is exposed on the first planar surface, and each of the second electrical connectors extends to the third planar surface; providing a redistribution layer on the third planar surface, the redistribution layer being electrically connected to each of the first electrical connectors and the second electrical connectors; and removing the second temporary carrier.

In one embodiment, before encapsulating the integrated electronic element module and the semiconductor device with the second molding compound, the second electrical connectors are formed on the semiconductor device, and after encapsulating the integrated electronic element module and the semiconductor device with the second molding compound, and before providing the redistribution layer over the third planar surface, the third planar surface of the second molding compound is planarized.

In one embodiment, after encapsulating the integrated electronic element module and the semiconductor device with the second molding compound, the second electrical connectors is formed through a part of the second molding compound.

In one embodiment, the method further comprises: forming a third molding compound on the fourth planar surface after removing the second temporary carrier.

Using the integrated electronic element module, electrical connectors of electronic elements and electrical connectors of semiconductor devices can be integrated at a same plane during the fabrication of a semiconductor package, facilitating the formation of a redistribution layer (RDL) without the need for a substrate or SMT process, and without forming additional elongated electrical connecting structures, as above described. A semiconductor package according to an embodiment and the method for fabricating the same have the same advantages as above.

It is understood that the foregoing general description and the following detailed description of the present embodiment are exemplary, and are intended to provide further explanation of the claimed technology.

We claim:

1. A semiconductor package, comprising:
   a substrate-less integrated electronic element module, comprising:
      at least two electronic elements, each of the at least two electronic elements having first electrical connectors, the electrical connectors comprising one or more of contact pads and conductive bumps and
      a first molding compound encapsulating the at least two electronic elements, the first molding compound comprising a first planar surface and an opposing second planar surface;
   a plurality of semiconductor dies comprising second electrical connectors; and
   a second molding compound encapsulating the substrate-less integrated electronic element module and the one or more semiconductor dies, the second molding compound comprising a third planar surface;
   wherein each of the first electrical connectors and the second electrical connectors are directly exposed on the third planar surface of the second molding compound; and
   wherein the at least two electronic elements are encapsulated inside both the first molding compound and the second molding compound, and
   wherein the plurality of semiconductor dies are encapsulated once inside the second molding compound.

2. The integrated electronic element module according to claim 1, wherein the at least two electronic elements comprise a combination of one or more of the following: a multi-layered ceramic capacitor, a silicon-based capacitor, a resistor, an inductor, an application specific integrated circuit die, a general purpose integrated circuit die, a wafer-level chip-scale package (WLCSP), and a quad flat no-lead package low dropout (QFN/LDO).

3. The integrated electronic element module according to claim 1, wherein the first electrical connectors comprise contact pads and conductive bumps formed only on a part of the first electrical connectors, wherein top surfaces of the conductive bumps and top surfaces of the first electrical connectors without the conductive bumps formed thereon are all coplanar with each other.

4. The integrated electronic element module according to claim 1, wherein the first electrical connectors comprise contact pads and conductive bumps formed on each of the first electrical connectors, wherein top surfaces of the conductive bumps are all coplanar with each other.

5. The integrated electronic element module according to claim 1, wherein the first electrical connectors have a gap smaller than 10 µm between closest adjacent first electrical connectors.

6. A semiconductor package, comprising:
   an integrated electronic element module, comprising:
      at least two electronic elements, each of the at least two electronic elements having first electrical connectors; and
      a first molding compound encapsulating the at least two electronic elements, the first molding compound comprising a first planar surface and an opposing second planar surface, each of the at least two electronic components mounted adjacent the first planar surface and each of the first electrical connectors exposed at the first planar surface;
   a semiconductor device comprising second electrical connectors;
   a second molding compound encapsulating the integrated electronic element module and the semiconductor device, the second molding compound comprising a third planar surface and an opposing fourth planar surface, the third planar surface being closer to the first planar surface than the second planar surface; and
   a redistribution layer formed over the third planar surface;
   wherein each of the first electrical connectors is directly exposed on the first planar surface, and is electrically connected to the redistribution layer, and
   wherein each of the second electrical connectors of the semiconductor device extends to the third planar surface, and is electrically connected to the redistribution layer.

7. The semiconductor package according to claim 6, wherein the semiconductor package is substrate-less.

8. The semiconductor package according to claim 6, wherein the at least two electronic elements comprise a combination of one or more of the following: a multi-layered ceramic capacitor, a silicon-based capacitor, a resistor, and inductor, an application specific integrated circuit die, a general purpose integrated circuit die, a wafer-level chip-scale package (WLCSP), and a quad flat no-lead package low dropout (QFN/LDO).

9. The semiconductor package according to claim 6, wherein the integrated electronic element module further comprises conductive bumps formed only on a part of the first electrical connectors, wherein top surfaces of the conductive bumps and top surfaces of each of the first electrical connectors without conductive bumps formed thereon are all coplanar with each other.

10. The semiconductor package according to claim 6, wherein the integrated electronic element module further comprises conductive bumps formed on each of the first electrical connectors, wherein top surfaces of the conductive bumps are all coplanar with each other.

11. The semiconductor package according to claim 6, wherein the first electrical connectors have a gap smaller than 10 µm between closest adjacent first electrical connectors.

12. The semiconductor package according to claim 6, wherein the semiconductor device comprises a plurality of stacked memory dies.

13. The semiconductor package according to claim 12, wherein the integrated electronic element module and the semiconductor device are disposed over the redistribution layer in a side-by-side manner.

14. The semiconductor package according to claim 13, wherein a thickness of the integrated electronic element module and the second molding compound of the semiconductor package have the same thickness.

15. The semiconductor package according to claim 13, further comprising a spacer disposed on a side of the integrated electronic element module facing away from the redistribution layer, and wherein a sum of a thickness of the integrated electronic element module and a thickness of the spacer equals to a thickness of the second molding compound of the semiconductor package.

16. The semiconductor package according to claim 12, wherein the integrated electronic element module is mounted next to the semiconductor device.

17. The semiconductor package according to claim 6, further comprising a third molding compound formed on the fourth planar surface.

18. A semiconductor package, comprising:
   an integrated electronic element module, comprising:
      at least two electronic elements, each of the at least two electronic elements having first electrical connectors; and a first molding compound encapsulating the at least two electronic elements, the first molding compound comprising a first planar surface and an opposing second planar surface;

a semiconductor device comprising second electrical connectors;

a second molding compound encapsulating the integrated electronic element module and the semiconductor device, the second molding compound comprising a third planar surface and an opposing fourth planar surface, the third planar surface being closer to the first planar surface than the second planar surface; and a redistribution layer formed over the third planar surface;

wherein each of the first electrical connectors is directly exposed on the first planar surface, and is electrically connected to the redistribution layer, and wherein each of the second electrical connectors of the semiconductor device extends to the third planar surface, and is electrically connected to the redistribution layer, and wherein the integrated electronic element module and the semiconductor device are disposed over the redistribution layer in a side-by-side manner, and wherein a thickness of the integrated electronic element module and the second molding compound of the semiconductor package have the same thickness.

* * * * *